United States Patent
Kim et al.

(10) Patent No.: US 11,165,143 B2
(45) Date of Patent: Nov. 2, 2021

(54) ANTENNA MODULE AND ELECTRONIC SYSTEM INCLUDING THE SAME

(71) Applicant: Samsung Electronics Co., Ltd., Suwon-si (KR)

(72) Inventors: Junghwa Kim, Seoul (KR); Heeseok Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 48 days.

(21) Appl. No.: 16/817,957

(22) Filed: Mar. 13, 2020

(65) Prior Publication Data
US 2021/0036413 A1    Feb. 4, 2021

(30) Foreign Application Priority Data
Aug. 1, 2019 (KR) .......................... 10-2019-0093774

(51) Int. Cl.
| | |
|---|---|
| *H01L 23/495* | (2006.01) |
| *H01Q 1/38* | (2006.01) |
| *H01L 23/498* | (2006.01) |
| *H01L 23/00* | (2006.01) |
| *H01L 23/31* | (2006.01) |
| *H01L 25/16* | (2006.01) |

(Continued)

(52) U.S. Cl.
CPC ........... *H01Q 1/38* (2013.01); *H01L 23/3128* (2013.01); *H01L 23/49822* (2013.01); *H01L 23/49833* (2013.01); *H01L 23/49838* (2013.01); *H01L 23/66* (2013.01); *H01L 24/05* (2013.01); *H01L 24/24* (2013.01); *H01L 25/16* (2013.01); *H01L 2223/6677* (2013.01); *H01L 2224/24195* (2013.01); *H01L 2224/24225* (2013.01); *H01L 2924/19105* (2013.01); *H01Q 9/0407* (2013.01); *H01Q 9/16* (2013.01)

(58) Field of Classification Search
USPC ....................................................... 257/668
See application file for complete search history.

(56) References Cited

U.S. PATENT DOCUMENTS

| | | |
|---|---|---|
| 7,675,465 B2 | 3/2010 | Doan et al. |
| 9,166,284 B2 | 10/2015 | Kamgaing et al. |

(Continued)

*Primary Examiner* — Niki H Nguyen
(74) *Attorney, Agent, or Firm* — Harness, Dickey & Pierce, P.L.C.

(57) ABSTRACT

An antenna module includes an antenna substrate, a fan-out package and first electrical connection structures. The antenna substrate includes a pattern layer including antenna and ground patterns, and a feeding layer under the pattern layer including a feeding network that supplies power to the antenna patterns. The fan-out package is under the antenna substrate and includes a semiconductor chip driving the antenna substrate, an encapsulant encapsulating some of the semiconductor chip, a first redistribution layer on the semiconductor chip electrically connecting the semiconductor chip with the antenna substrate, and a second redistribution layer under the semiconductor chip electrically connecting the semiconductor chip with external devices. The first electrical connection structures are between and electrically connect the antenna substrate and the fan-out package. A logic layer including logic patterns electrically connecting the pattern layer with the feeding layer in the antenna substrate in the first redistribution layer in the fan-out package.

20 Claims, 14 Drawing Sheets

(51) Int. Cl.
*H01L 23/66* (2006.01)
*H01Q 9/04* (2006.01)
*H01Q 9/16* (2006.01)

(56) References Cited

U.S. PATENT DOCUMENTS

| | | |
|---|---|---|
| 9,413,079 B2 | 8/2016 | Kamgaing et al. |
| 10,128,177 B2 | 11/2018 | Kamgaing et al. |
| 2012/0235880 A1 | 9/2012 | Kim et al. |
| 2018/0102595 A1* | 4/2018 | Wang ................. H01Q 1/22 |
| 2019/0035749 A1* | 1/2019 | Dalmia ............... H01L 23/552 |
| 2019/0067221 A1 | 2/2019 | Lasiter et al. |
| 2020/0035625 A1* | 1/2020 | Wang ................. H01Q 21/062 |

* cited by examiner

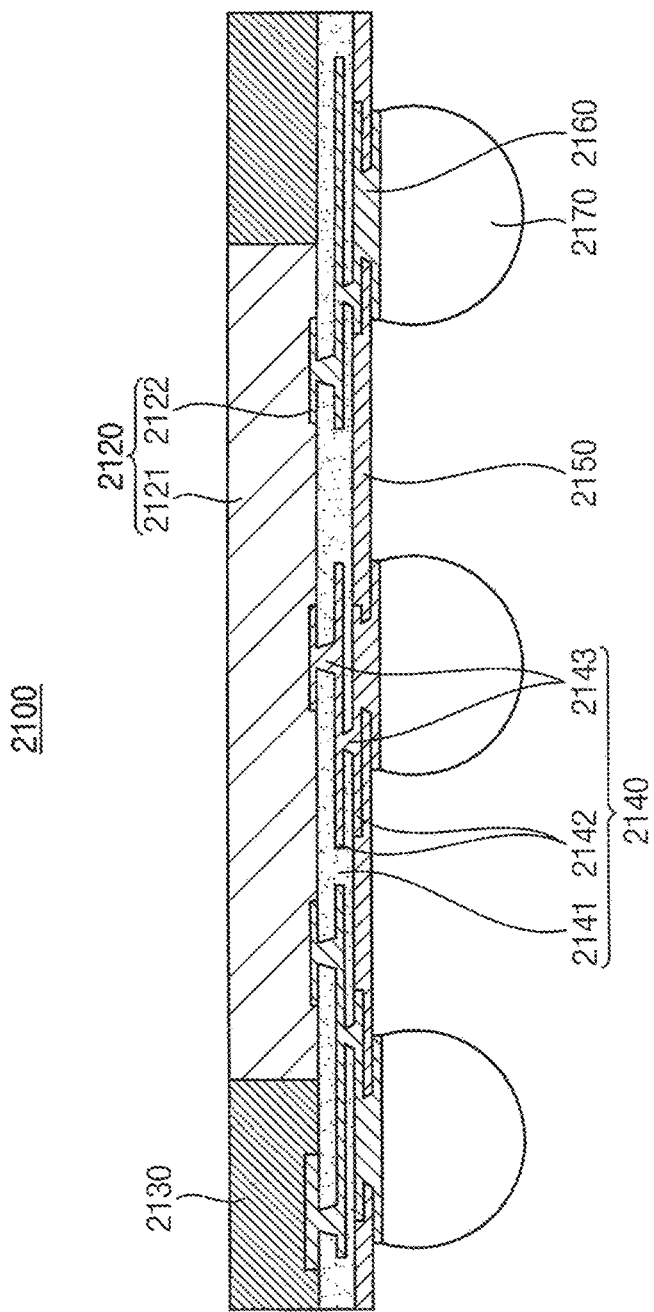

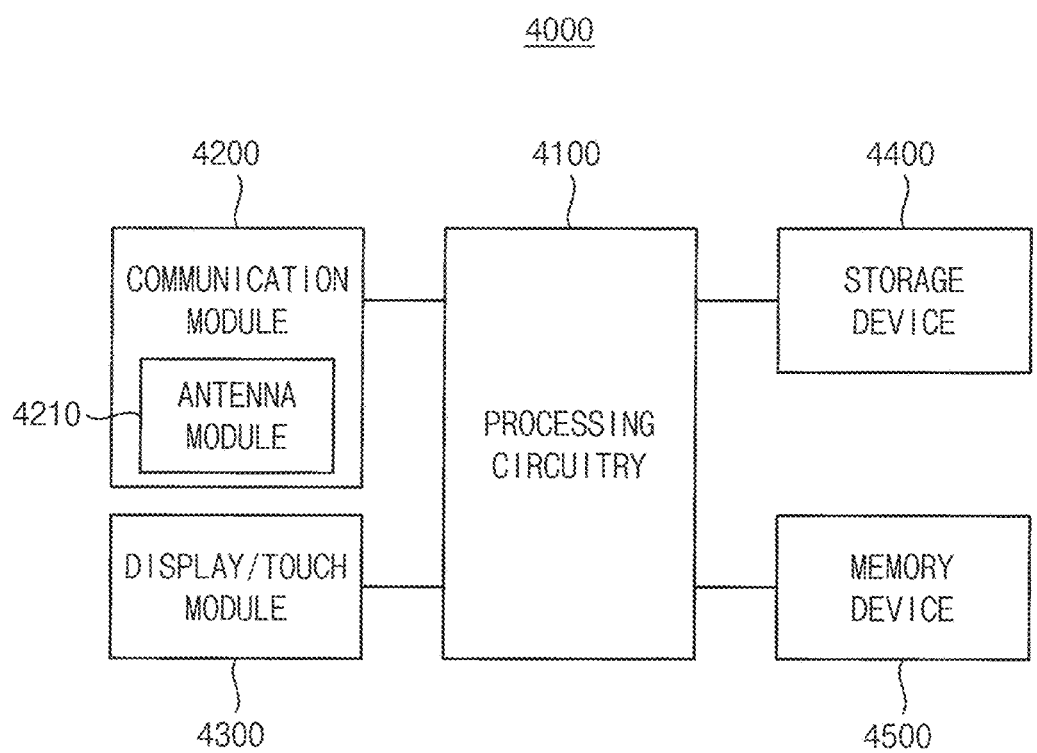

ANTENNA MODULE AND ELECTRONIC SYSTEM INCLUDING THE SAME

CROSS-REFERENCE TO RELATED APPLICATION

This application claims priority under 35 USC § 119 to Korean Patent Application No. 10-2019-0093774, filed on Aug. 1, 2019 in the Korean Intellectual Property Office (KIPO), the contents of which are herein incorporated by reference in their entirety.

BACKGROUND

1. Technical Field

Example embodiments relate generally to semiconductor integrated circuits, and more particularly to antenna modules and electronic systems including the antenna modules.

2. Description of the Related Art

Applications that use millimeter waves of 10 GHz or more have been widely used for motion sensor products that detect motion to increase user interface (I/F) convenience, action monitoring sensor products for security that confirm an intruder in a predetermined space, 24 GHz and 77 GHz radar systems for near-field and far-field detection for an automobile, and the like, as well as fifth generation (5G) communications for mobile or 60 GHz communications. In the case of a product using the millimeter waves as described above, when a signal is transferred from a radio frequency integrated circuit (RFIC) to an antenna or from the antenna to the RFIC, the signal should be transferred so that loss of the signal is minimized. Conventionally, to this end, the RFIC and the antenna are connected to each other by a coaxial cable to minimize signal attenuation, which is inefficient in terms of space and cost.

SUMMARY

At least one example embodiment of the present disclosure provides an antenna module capable of reducing a thickness of an antenna substrate and a turn around time (TAT) during a development of the antenna module.

At least one example embodiment of the present disclosure provides an electronic system including the antenna module.

According to example embodiments, an antenna module includes an antenna substrate, a fan-out package and a plurality of first electrical connection structures. The antenna substrate includes a pattern layer and a feeding layer. The pattern layer includes a plurality of antenna patterns and a plurality of ground patterns. The feeding layer is under the pattern layer and includes a feeding network that supplies power to the plurality of antenna patterns. The fan-out package is under the antenna substrate and includes a semiconductor chip, an encapsulant, a first redistribution layer and a second redistribution layer. The semiconductor chip is configured to drive the antenna substrate. The encapsulant encapsulates at least portions of the semiconductor chip. The first redistribution layer is on the semiconductor chip and electrically connects the semiconductor chip with the antenna substrate. The second redistribution layer is under the semiconductor chip and electrically connects the semiconductor chip with an external printed circuit board. The plurality of first electrical connection structures are between the antenna substrate and the fan-out package and electrically connect the antenna substrate with the fan-out package. A logic layer that includes a plurality of logic patterns electrically connecting the pattern layer with the feeding layer in the antenna substrate is within the first redistribution layer in the fan-out package.

According to example embodiments, an electronic system includes a processor and a communication module. The communication module is configured to be controlled by the processor, communicates with an external system, and includes an antenna module. The antenna module includes an antenna substrate, a fan-out package and a plurality of first electrical connection structures. The antenna substrate includes a pattern layer and a feeding layer. The pattern layer includes a plurality of antenna patterns and a plurality of ground patterns. The feeding layer is under the pattern layer and includes a feeding network that supplies power to the plurality of antenna patterns. The fan-out package is under the antenna substrate and includes a semiconductor chip, an encapsulant, a first redistribution layer and a second redistribution layer. The semiconductor chip drives the antenna substrate. The encapsulant encapsulates at least portions of the semiconductor chip. The first redistribution layer is on the semiconductor chip and electrically connects the semiconductor chip with the antenna substrate. The second redistribution layer is under the semiconductor chip and electrically connects the semiconductor chip with an external printed circuit board. The plurality of first electrical connection structures are between the antenna substrate and the fan-out package and electrically connect the antenna substrate with the fan-out package. A logic layer that includes a plurality of logic patterns electrically connecting the pattern layer with the feeding layer in the antenna substrate is within the first redistribution layer in the fan-out package.

According to example embodiments, an antenna module includes an antenna substrate, a fan-out package, a plurality of first electrical connection structures and a plurality of external electrical connection structures. The antenna substrate includes a pattern layer and a feeding layer. The pattern layer includes a plurality of antenna patterns and a plurality of ground patterns. The feeding layer is under the pattern layer and includes a feeding network that supplies power to the plurality of antenna patterns. The fan-out package is under the antenna substrate and includes a semiconductor chip, a passive element, an encapsulant, a first redistribution layer, a second redistribution layer and a plurality of core vias. The semiconductor chip drives the antenna substrate and includes at least one of a radio frequency integrated circuit (RFIC) and a power management integrated circuit (PMIC). The passive element is adjacent to the semiconductor chip and includes at least one of a capacitor and an inductor. The encapsulant encapsulates at least portions of the semiconductor chip and the passive element. The first redistribution layer is on the semiconductor chip and electrically connects the semiconductor chip with the antenna substrate. The second redistribution layer is under the semiconductor chip and electrically connects the semiconductor chip with an external printed circuit board. The plurality of core vias electrically connect the first redistribution layer with the second redistribution layer. The plurality of first electrical connection structures are between the antenna substrate and the fan-out package and electrically connect the antenna substrate with the fan-out package. The plurality of external electrical connection structures are under the fan-out package and electrically connect the antenna module with the external printed circuit board. A logic layer that includes a plurality of logic patterns electrically connecting the pattern layer with the feeding layer in the antenna substrate is within the first redistribution layer in the fan-out package. The pattern layer and the feeding layer are not electrically connected to each other in the antenna substrate but are electrically connected to each other through the logic layer in the fan-out package. A bottom surface of the antenna substrate and a top surface of the fan-out package are spaced apart from each other by a desired (and/or alternatively predetermined) distance. The semiconductor chip includes an active surface having pads thereon and an inactive surface opposite to the active surface. The semiconductor chip is in face-up form such that the active surface is directed toward the antenna substrate.

In the antenna module and the electronic system according to example embodiments, the logic layer for electrically connecting the pattern layer with the feeding layer in the antenna substrate may not be in the antenna substrate, but may be in the redistribution layer of the fan-out package. The logic layer may be separated from the antenna substrate and may be implemented in the fan-out package. Accordingly, a thickness of the antenna substrate may be reduced, a turn around time (TAT) to design and develop the antenna substrate may be reduced, and a yield in manufacturing the antenna substrate may be improved or enhanced.

BRIEF DESCRIPTION OF THE DRAWINGS

Illustrative, non-limiting example embodiments will be more clearly understood from the following detailed description taken in conjunction with the accompanying drawings.

FIGS. 4A and 4B are diagrams for describing a structure of a fan-out package included in an antenna module according to example embodiments.

FIG. 12 is a block diagram illustrating an electronic system according to example embodiments.

DETAILED DESCRIPTION OF THE EMBODIMENTS

Figure 1:
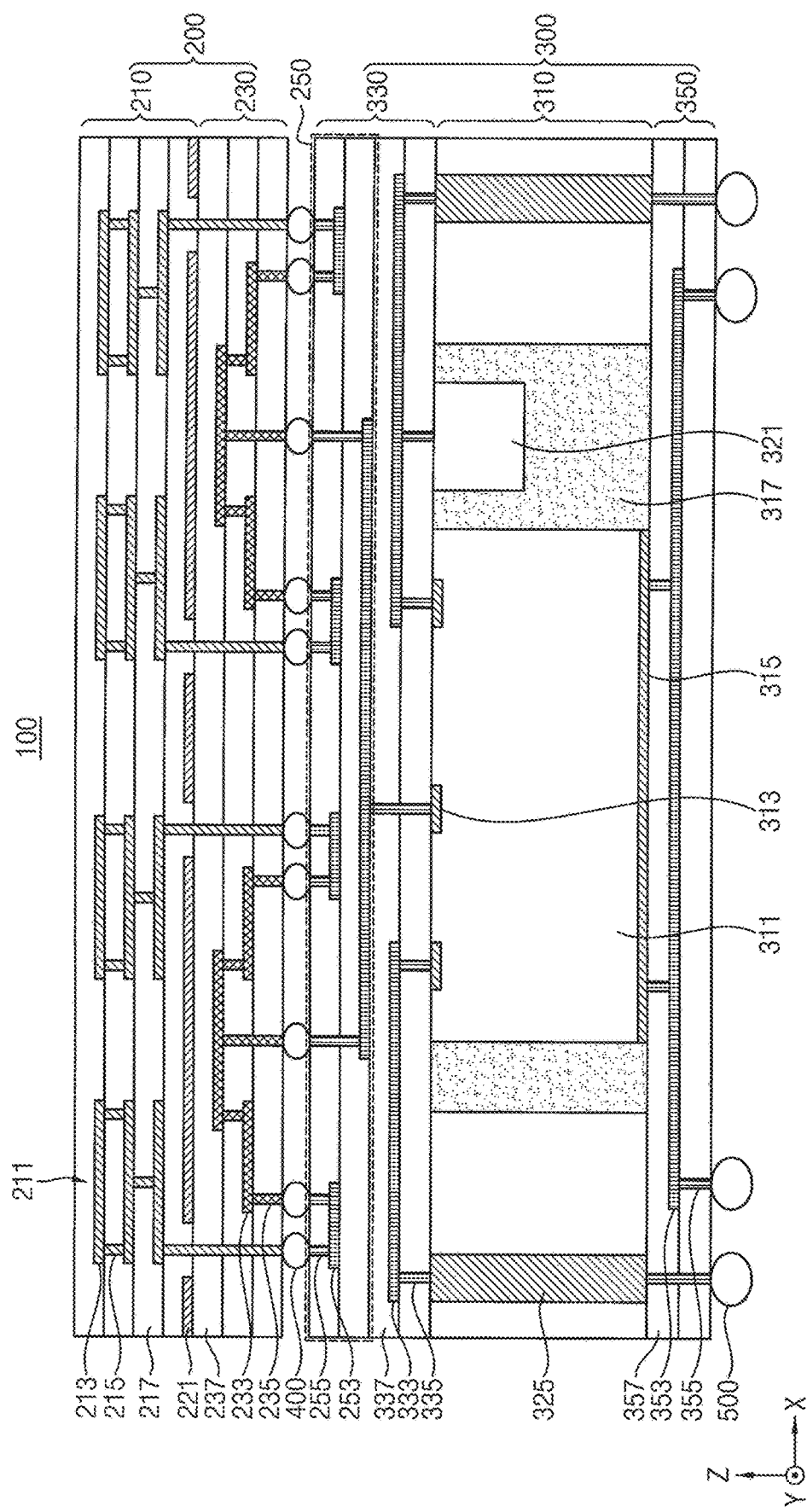
FIG. 1 is a cross-sectional view of an antenna module according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

It will be understood that an element that is "on" another element may be above or below the other element. It will be further understood that an element that is "on" another element may be "directly" on the other element, such that the elements are in direct contact with each other, or may be "indirectly" on the other element, such that the elements are isolated from direct contact with each other by one or more interposing spaces and/or structures.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

FIG. 1 is a cross-sectional view of an antenna module according to example embodiments.

Referring to FIG. 1, an antenna module 100 includes an antenna substrate 200, a fan-out package 300 and a plurality of first electrical connection structures 400. The antenna module 100 may further include a plurality of external electrical connection structures 500.

The antenna module 100 may be referred to as an antenna package. For example, the antenna module 100 may be referred to as an antenna-in-package (AIP) because a package itself includes an antenna internally.

The antenna substrate 200 includes a pattern layer 210 and a feeding layer 230.

The pattern layer 210 includes a plurality of antenna patterns 211 formed by a plurality of antenna wirings 213 and a plurality of antenna vias 215, and a plurality of ground patterns 221. The pattern layer 210 may further include a plurality of insulating layers 217.

The plurality of antenna patterns 211 may be formed in an upper portion of the pattern layer 210, and the plurality of ground patterns 221 may be formed in a lower portion the pattern layer 210. For example, the plurality of antenna patterns 211 may include at least one of a patch antenna and a dipole antenna. Although four antenna patterns 211 are illustrated in FIG. 1, the number of the antenna patterns may be changed according to example embodiments. Example structures of the plurality of antenna patterns 211 will be described with reference to FIGS. 2A and 2B.

In some example embodiments, the plurality of antenna wirings 213, the plurality of antenna vias 215 and the plurality of ground patterns 221 may include a conductive material such as copper (Cu), aluminum (Al), silver (Ag), tin (Sn), gold (Au), nickel (Ni), lead (Pb), titanium (Ti), and/or alloys thereof.

The plurality of insulating layers 217 may electrically insulate at least portions of the plurality of antenna wirings 213 and at least portions of the plurality of ground patterns 221.

In some example embodiments, the plurality of insulating layers 217 may include an insulating material. For example, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), and/or the like.

In some example embodiments, at least portions of the plurality of insulating layers 217 may include a photosensitive insulating material such as a photoimagable dielectric (PID) resin. In other words, the at least portions of the plurality of insulating layers 217 may be a photosensitive insulating layer. When the insulating layer 217 has photosensitive properties, the insulating layer 217 may be formed to have a lower thickness, and a fine pitch of the vias 215 may be achieved more easily. The insulating layer 217 may be a photosensitive insulating layer including an insulating resin and an inorganic filler. When the insulating layers 217 are multiple layers, materials of the insulating layers 217 may be the same as each other, and may also be different from each other, if necessary. When the insulating layers 217 are the multiple layers, the insulating layers 217 may be integrated with each other depending on a process, such that a boundary therebetween may also not be apparent.

In some example embodiments, the uppermost insulating layer among the plurality of insulating layers 217 may be a passivation layer. The passivation layer may protect the antenna substrate 200 from external physical and/or chemical damages. The passivation layer may include an insulating resin and an inorganic filler, but may not include a glass fiber. For example, the passivation layer may be formed of an ABF. However, the passivation layer is not limited thereto, but may also be formed of a PID, a solder resist, and/or the like.

The feeding layer 230 is disposed under the pattern layer 210, and includes a feeding network (or a feed network) formed by a plurality of feeding wirings 233 and a plurality of feeding vias 235. The feeding layer 230 may further include a plurality of insulating layers 237.

The feeding network supplies power to the plurality of antenna patterns 211. Example structures of the feeding network will be described with reference to FIGS. 3A and 3B.

The plurality of insulating layers 237 may electrically insulate at least portions of the plurality of feeding wirings 233.

In some example embodiments, materials included in the plurality of feeding wirings 233 and the plurality of feeding vias 235 may be substantially the same as the materials included in the plurality of antenna wirings 213, the plurality of antenna vias 215 and the plurality of ground patterns 221, and materials included in the plurality of insulating layers 237 may be substantially the same as the materials included in the plurality of insulating layers 217.

The fan-out package (or a fan-out semiconductor package) 300 is disposed under the antenna substrate 200, and includes a core layer 310, a first redistribution layer 330 and a second redistribution layer 350.

The core layer 310 includes a semiconductor chip 311 and an encapsulant 317. The core layer 310 may further include a metal layer 315, at least one passive element 321 and core vias 325.

The semiconductor chip 311 generates and provides signals for driving the antenna substrate 200. The semiconductor chip 311 may be disposed in a through-hole of the core layer 310, and may include an active surface having pads (or connection pads) 313 disposed thereon and an inactive surface opposite to the active surface. For example, the semiconductor chip 311 may include a radio frequency integrated circuit (RFIC). For another example, the semiconductor chip 311 may include a power management integrated circuit (PMIC). Alternatively, the semiconductor chip 311 may include both the RFIC and the PMIC. Although only one semiconductor chip 311 is illustrated in FIG. 1, the number of the semiconductor chips may be changed according to example embodiments.

The semiconductor chip 311 may be an integrated circuit (IC) in a bare state, provided in an amount of several hundreds to several millions of elements or more integrated in a single chip. The semiconductor chip 311 may include a body on which various circuits are formed, and the pads 313 may be formed on an active surface of the body. The body may be formed on the basis of, for example, an active wafer, and silicon (Si), germanium (Ge), gallium arsenide (GaAs), and/or the like, may be used as a basic material of the body. The pads 313 may electrically connect the semiconductor chip 311 to other components, and materials of the pads 313 may be a conductive material such as aluminum (Al), but is not limited thereto. Although not illustrated in FIG. 1, a passivation layer (not illustrated) having openings exposing at least portions of the pads 313 and formed of an oxide layer, a nitride layer, and/or the like, may be formed on the active surface of the semiconductor chip 311. For example, a pad may be a contact pad or a contact pin, but is not limited thereto.

In an example embodiment of FIG. 1, the semiconductor chip 311 may be disposed in face-up form such that the active surface is directed toward the antenna substrate 200, and thus may have a shortest signal path up to the antenna.

The metal layer 315 may be formed on the inactive surface of the semiconductor chip 311. In some example embodiments, the metal layer 315 may be used as a heat dissipation element or may be used as a signal path.

The at least one passive element 321 may be disposed in the through-hole of the core layer 310 and may be disposed adjacent to (e.g., side by side with) the semiconductor chip 311. For example, the passive element 321 may include a capacitor. For another example, the passive element 321 may include an inductor. Alternatively, the passive element 321 may include both the capacitor and the inductor. Although only one passive element 321 is illustrated in FIG. 1, the number of the passive elements may be changed according to example embodiments.

The encapsulant 317 may encapsulate or protect the semiconductor chip 311, the passive element 321, and the like, and may provide an insulating region. An encapsulation form of the encapsulant 317 is not particularly limited, but may be a form in which the encapsulant 317 surrounds at least portions of the semiconductor chip 311 and the passive element 321. For example, the encapsulant 317 may cover side surfaces and the inactive surface of the semiconductor chip 311, and may cover side surfaces and lower surfaces of the passive element 321. In addition, the encapsulant 317 may fill a space in the through-hole of the core layer 310. A material of the encapsulant 317 is not particularly limited, but may be, for example, a photoimagable encapsulant (PIE). Alternatively, an insulating material such as ABF, or the like, may be used, if necessary.

The core vias 325 may electrically connect the first redistribution layer 330 with the second redistribution layer 350, resulting in an electrical path in the core layer 310. Materials of the core vias 325 may be a conductive material such as copper (Cu), aluminum (Al), silver (Ag), tin (Sn), gold (Au), nickel (Ni), lead (Pb), titanium (Ti), and/or alloys thereof. Each of the core vias 325 may be entirely filled with the conductive material, or the conductive material may be formed along a wall of respective via holes. In addition, each of the core vias 325 may have any known shape such as an hourglass shape, a cylindrical shape, and the like. The core vias 325 may include vias for ground (GND), vias for power (PWR), and vias for signals, and the like. Here, the vias for signals may include vias for various signals other than the ground and the power, such as data signals, and the like.

The first redistribution layer 330 is disposed on the core layer 310 including the semiconductor chip 311, and electrically connects the semiconductor chip 311 with the antenna substrate 200. The first redistribution layer 330 may include a plurality of wirings 333 and a plurality of vias 335 for redistributing the pads 313 of the semiconductor chip 311, and may include a plurality of insulating layers 337 for electrically insulating at least portions of the plurality of wirings 333. The first redistribution layer 330 may also electrically connect the semiconductor chip 311 with the passive element 321 or may also electrically connect the passive element 321 with the antenna substrate 200.

In addition, the first redistribution layer 330 includes a logic layer 250 that includes a plurality of logic patterns. The plurality of logic patterns are patterns for electrically connecting the pattern layer 210 with the feeding layer 230 in the antenna substrate 200. The plurality of logic patterns may be formed by a plurality of logic wirings 253 and a plurality of logic vias 255. At least portions of the plurality of logic wirings 253 may be electrically insulated by the plurality of insulating layers 337.

In an example embodiment of FIG. 1, the logic layer 250 may be disposed within the fan-out package 300 instead of within the antenna substrate 200. Thus, the plurality of antenna patterns 211 in the pattern layer 210 and the feeding network in the feeding layer 230 may not be electrically connected to each other in the antenna substrate 200, but may be electrically connected to each other through the logic layer 250 in the fan-out package 300. However, example embodiments are not limited thereto. In some example embodiments, the plurality of antenna patterns 211 and the feeding network may be electrically connected to each other in the antenna substrate 200, and the logic layer 250 in the fan-out package 300 may implement an additional electrical connection with the plurality of antenna patterns 211 and the feeding network.

Figure 4B:
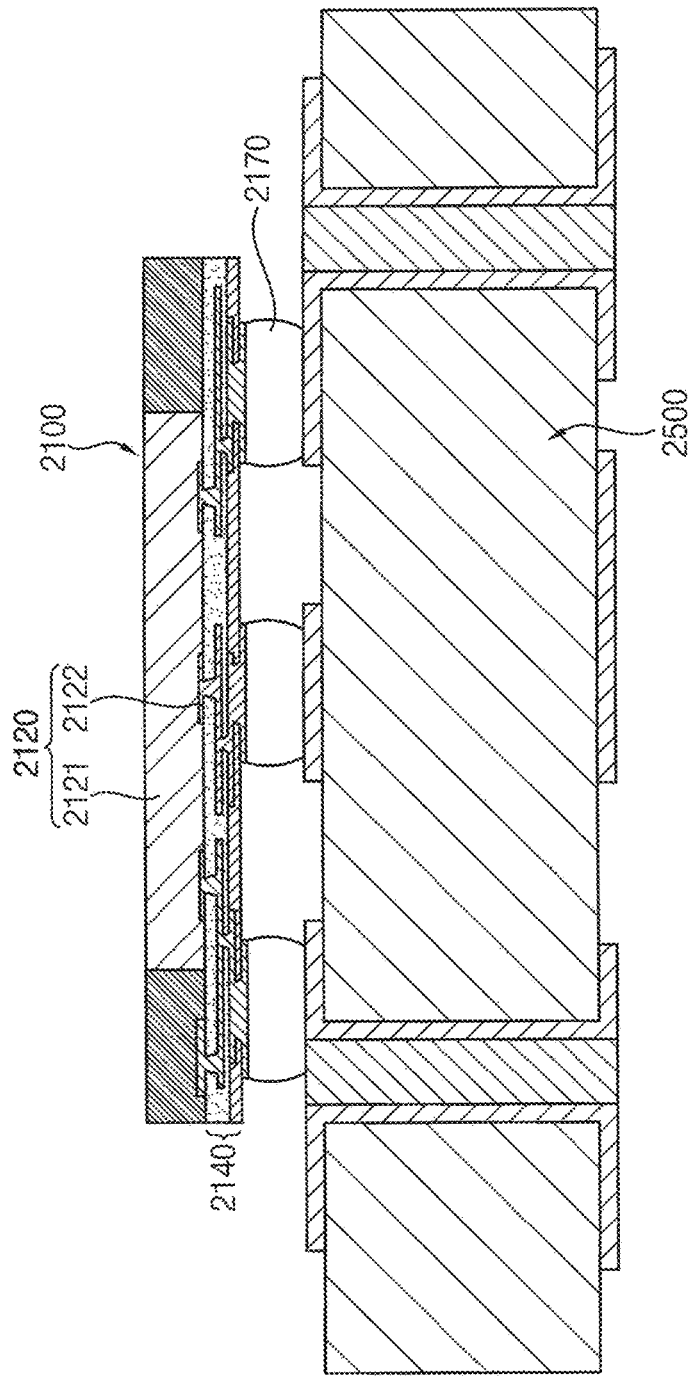

The second redistribution layer 350 is disposed under the core layer 310 including the semiconductor chip 311, and electrically connects the semiconductor chip 311 with an external printed circuit board (e.g., a printed circuit board 2500 in FIG. 4B). The second redistribution layer 350 may include a plurality of wirings 353 and a plurality of vias 355, and may include a plurality of insulating layers 357 for electrically insulating at least portions of the plurality of wirings 353.

In some example embodiments, materials included in the plurality of logic wirings 253, the plurality of logic vias 255, the plurality of wirings 333 and 353 and the plurality of vias 335 and 355 may be substantially the same as the materials included in the plurality of antenna wirings 213, the plurality of antenna vias 215 and the plurality of ground patterns 221, and materials included in the plurality of insulating layers 337 and 357 may be substantially the same as the materials included in the plurality of insulating layers 217.

In some example embodiments, the lowermost insulating layer among the plurality of insulating layers 357 may be a passivation layer for protecting the fan-out package 300 from external physical and/or chemical damages.

The plurality of first electrical connection structures 400 are disposed between the antenna substrate 200 and the fan-out package 300, and electrically connect the antenna substrate 200 with the fan-out package 300. For example, the plurality of first electrical connection structures 400 may be formed of a conductive material, for example, a solder, or the like. However, this is only an example, and materials of each of the first electrical connection structures 400 are not limited thereto. The first electrical connection structures 400 may be a land, a ball, a pin, and/or the like. The first electrical connection structures 400 may be formed as a multilayer or single layer structure. When the first electrical connection structures 400 are formed as a multilayer structure, the first electrical connection structures 400 may include a copper (Cu) pillar and a solder. When the first electrical connection structures 400 are formed as a single layer structure, the first electrical connection structures 400 may include a tin-silver solder, copper (Cu), and/or the like. However, this is only an example, and the first electrical connection structures 400 are not limited thereto. The number, an interval, a disposition form, and the like, of the first electrical connection structures 400 are not particularly limited, but may be sufficiently modified depending on design particulars by those skilled in the art.

In some example embodiments, the antenna substrate 200 and the fan-out package 300 may be independently and separately manufactured through separate processes and then electrically connected to each other by the plurality of first electrical connection structures 400. In other words, the antenna substrate 200 and the fan-out package 300 may not be manufactured by being integrated and/or combined in a single process, but may be separately manufactured and then form one antenna module 100 in a manner that is electrically connected to each other through a subsequent process. Thus, in the antenna module 100, the antenna substrate 200 and the fan-out package 300 may be formed to be spaced apart from each other in a vertical direction Z, and a bottom surface of the antenna substrate 200 and a top surface of the fan-out package 300 may be spaced apart from each other by a desired (and/or alternatively predetermined) distance. Although not illustrated in FIG. 1, a dielectric layer including an air and/or a dielectric material may be formed between the antenna substrate 200 and the fan-out package 300.

The plurality of external electrical connection structures 500 may be configured to physically and/or electrically connect the antenna module 100 with an external element. For example, the antenna module 100 may be mounted on the external printed circuit board through the plurality of external electrical connection structures 500.

In some example embodiments, materials included in the plurality of external electrical connection structures 500 may be substantially the same as the materials included in the plurality of first electrical connection structures 400.

In some example embodiments, at least one of the external electrical connection structures 500 may be disposed in a fan-out region. The fan-out region is a region other than a region in which the semiconductor chip 311 is disposed. A fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

When an RFIC and an antenna are formed as one module (or composite module), it should be considered how to implement an antenna, a ground surface, a dielectric material, a feeding network, and the like, in order to determine a resonance frequency and a bandwidth of the antenna. For example, a distance between the antenna and the ground surface that has a sensitive influence on characteristics of the antenna, e.g., a thickness of an air layer and/or a thickness of a dielectric material, needs to be constantly maintained and managed in order to obtain stable radiation characteristics of the antenna.

The antenna module 100 according to example embodiments may have a structure in which the fan-out package 300 (in which the semiconductor chip 311 such as the RFIC, or the like, is packaged in face-up form) is electrically connected to (e.g., integrated with) the antenna substrate 200 including the antenna patterns 211 such as a dipole antenna, a patch antenna, or the like. Therefore, the distance between the antenna and the ground surface may be stably formed in a single module regardless of a change in an external environment to maintain radiation characteristics of the antenna, and in addition, a signal path between the antenna and the semiconductor chip may be significantly reduced to obtain stable radio frequency (RF) characteristics.

Further, a size of the antenna may be reduced by using a dielectric constant of the insulating layers in the antenna substrate 200 and a dielectric constant of the insulating layers in the fan-out package 300 to simplify the entire structure of the antenna module 100, resulting in improvement of spatial efficiency and reduction of a cost. Furthermore, deterioration of the performance of the antenna due to an influence of foreign materials in the space between the antenna and the ground surface may also be reduced or prevented. In addition, rigidity of the antenna module 100 may be improved by introduction of the core layer 310, and the core layer 310 may provide an electrical connection path to effectively provide a signal path in the antenna module 100, or the like. The passive element 321 may be embedded together with the semiconductor chip 311 in the fan-out package 300 to significantly reduce loss of signals, power, and the like.

In the antenna module 100 according to example embodiments, the logic layer 250 for electrically connecting the pattern layer 210 with the feeding layer 230 in the antenna substrate 200 may not be disposed in the antenna substrate 200, but may be disposed in the redistribution layer of the fan-out package 300. The logic layer 250 may be separated from the antenna substrate 200 and may be implemented in the fan-out package 300. Accordingly, a thickness of the antenna substrate 200 may be reduced, a turn around time (TAT) to design and develop the antenna substrate 200 may be reduced, and a yield in manufacturing the antenna substrate 200 may be improved or enhanced.

Figure 2A:
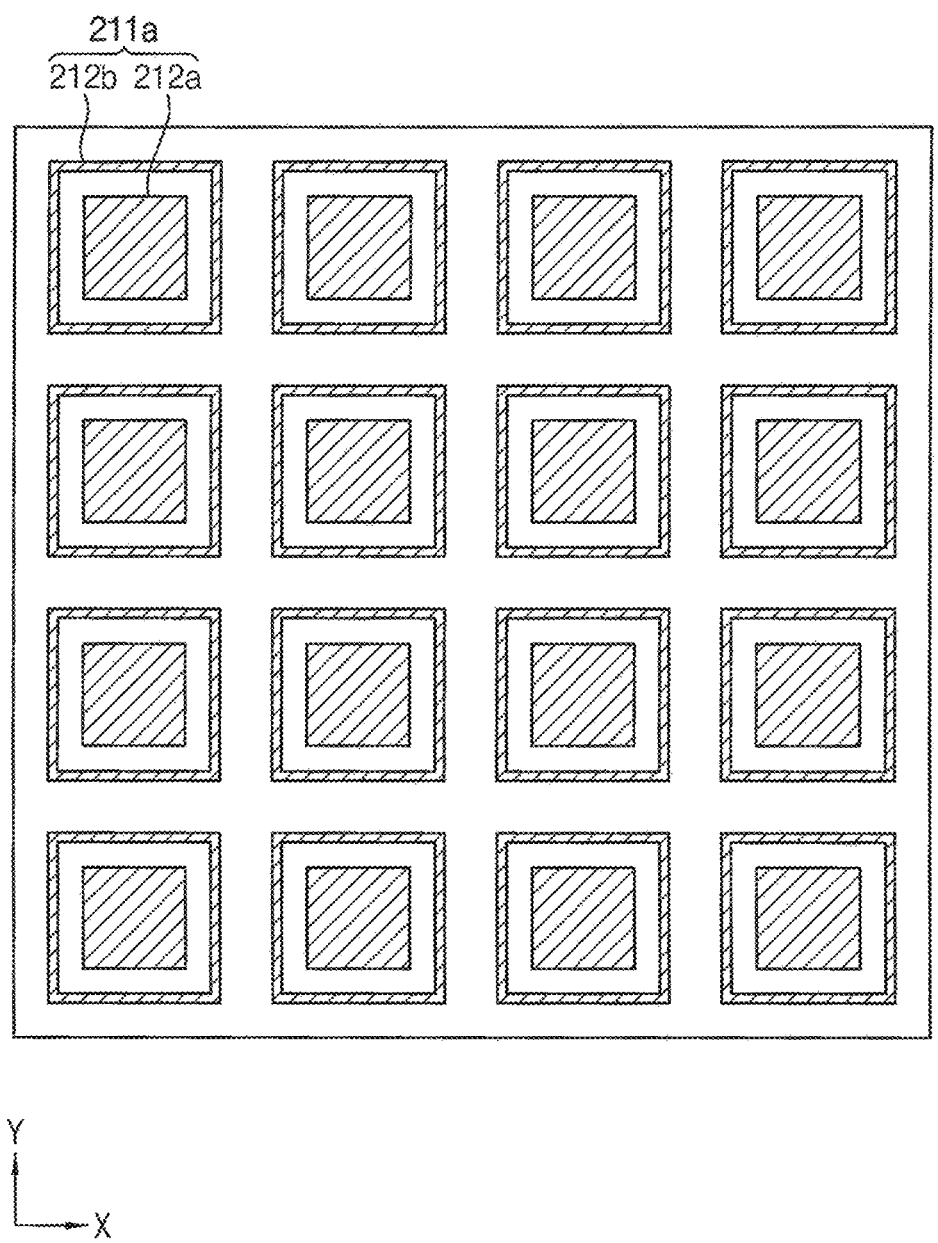
FIGS. 2A and 2B are diagrams illustrating examples of antenna patterns included in an antenna module according to example embodiments.
Figure 2B:
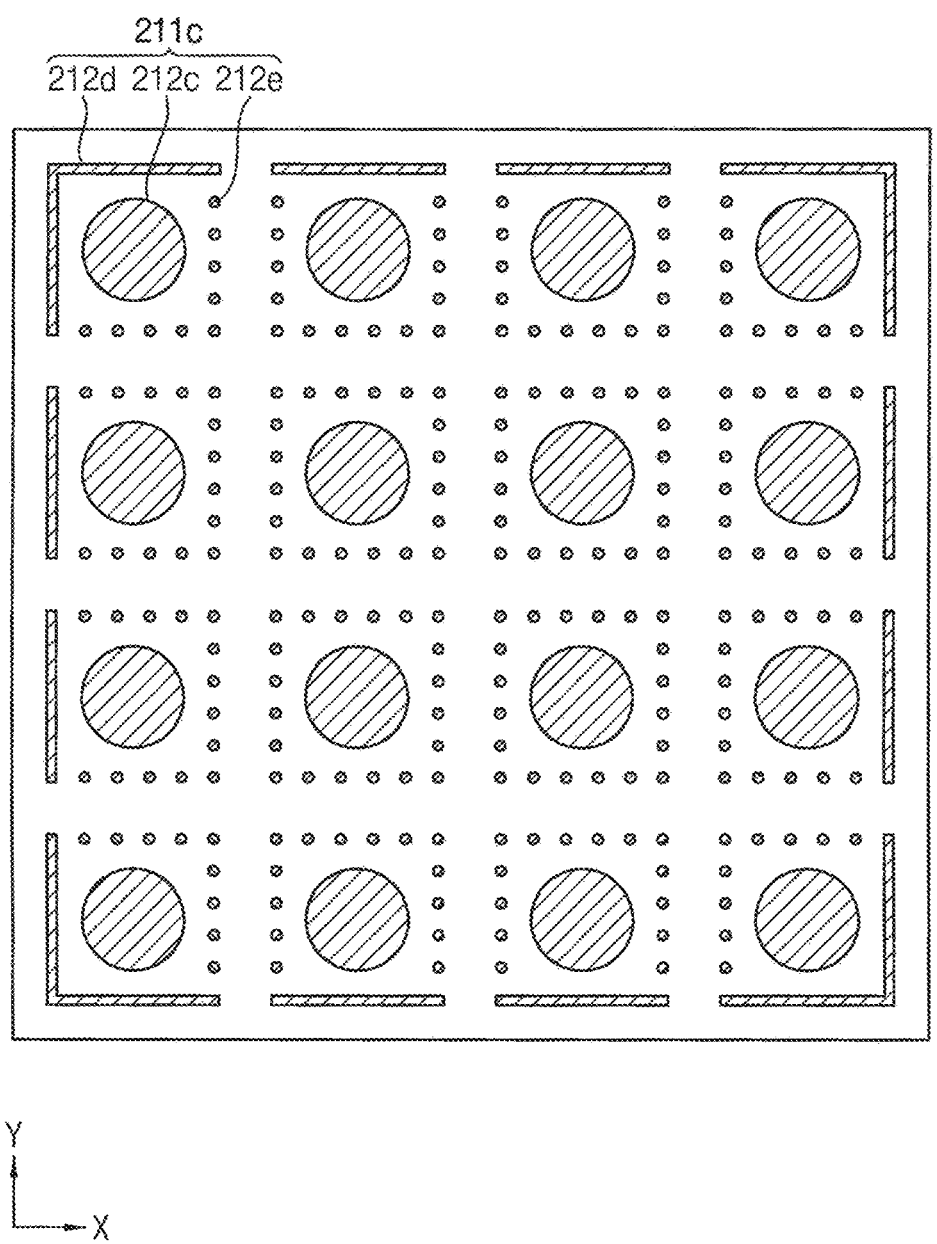

FIGS. 2A and 2B are diagrams illustrating examples of antenna patterns included in an antenna module according to example embodiments.

Referring to FIG. 2A, each of a plurality of antenna patterns 211a arranged along horizontal directions (e.g., along a first direction X and a second direction Y crossing the first direction X) may include a first pattern 212a and a second pattern 212b. The first pattern 212a may be a patch antenna or a dipole antenna. The second pattern 212b may be a plating member. The first pattern 212a may be surrounded by the second pattern 212b.

Referring to FIG. 2B, each of a plurality of antenna patterns 211c may include a first pattern 212c, a second pattern 212d and third patterns 212e. The first pattern 212c may be a patch antenna or a dipole antenna. The second pattern 212d may be a plating member. The third patterns 212e may be shielding vias. The first pattern 212c may be surrounded by the second pattern 212d and the third patterns 212e.

The structures of the antenna patterns illustrated in FIGS. 2A and 2B are only examples, and the antenna patterns included in the antenna module according to example embodiments may not be limited to the examples illustrated in FIGS. 2A and 2B. In addition, although the antenna patterns 211a and 211c arranged in a 4*4 matrix formation are illustrated in FIGS. 2A and 2B, the number of the antenna patterns may be changed according to example embodiments.

Figure 3A:
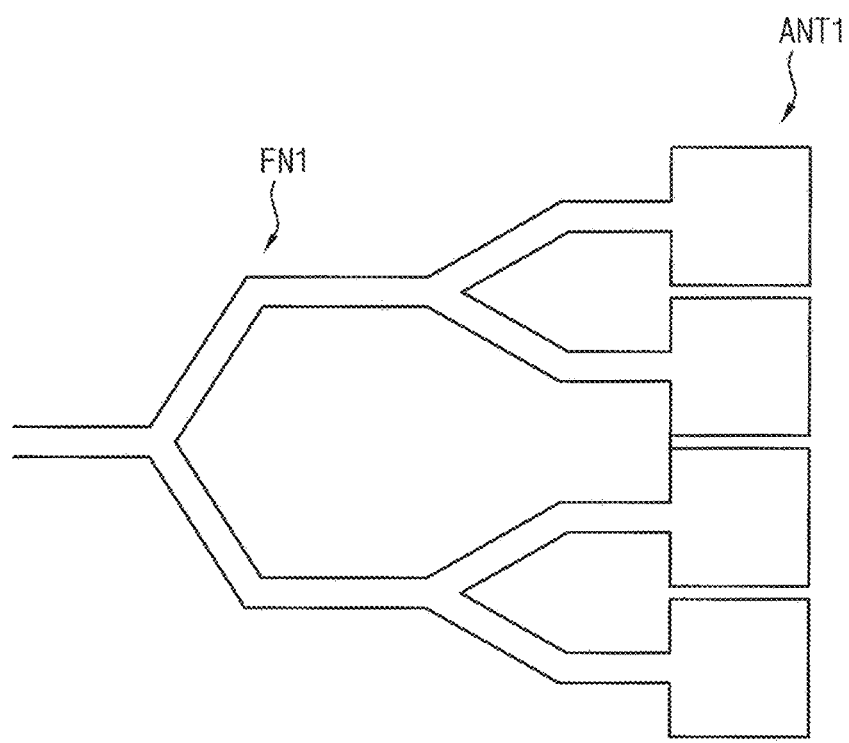
FIGS. 3A and 3B are diagrams illustrating examples of a feeding network included in an antenna module according to example embodiments.
Figure 3B:
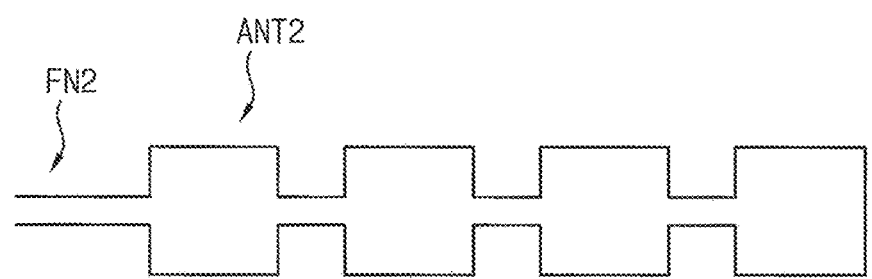

FIGS. 3A and 3B are diagrams illustrating examples of a feeding network included in an antenna module according to example embodiments.

Referring to FIG. 3A, a corporate feeding network FN1 for supplying power to a plurality of antenna patterns ANT1 is illustrated. The corporate feeding network FN1 is the most widely used type for a passive antenna. In the corporate feeding network FN1, a first single wiring is branched to connect all of the plurality of antenna patterns ANT1 as illustrated in FIG. 3A. This technique may integrate an RF feeding network with radiating elements on the same substrate. Minimization of losses in a microstrip feeding network may results in microstrip antenna arrays with high efficiency. Efficiency of the microstrip antenna arrays may be improved by using a waveguide feeding network.

In some example embodiments, the feeding network formed in the feeding layer 230 of the antenna substrate 200 in FIG. 1 may be a corporate feeding network similar to that illustrated in FIG. 3A.

Referring to FIG. 3B, a series feeding network FN2 for supplying power to a plurality of antenna patterns ANT2 is illustrated. In the series feeding network FN2, the plurality of antenna patterns ANT2 are connected in series as illustrated in FIG. 3B, and thus an input signal, fed from one end of the series feeding network FN2, is coupled serially to the plurality of antenna patterns ANT2. The compact feed network of series-fed antenna arrays is one of the main advantages that make them more attractive than their parallel-fed counterparts. Beside compactness, the small size of series-fed arrays results in less insertion and radiation losses by the feed network. Although a center-fed series feeding network connected to centers of the plurality of antenna patterns ANT2 is illustrated in FIG. 3B, the series feeding network FN2 may be implemented in the form of an end-fed series feeding network connected to ends of the plurality of antenna patterns ANT2.

The structures of the feeding network illustrated in FIGS. 3A and 3B are only examples, and the feeding network included in the antenna module according to example embodiments may not be limited to the examples illustrated in FIGS. 3A and 3B. In addition, although not illustrated in FIGS. 3A and 3B, connections between the antenna patterns and the feeding network may be implemented with various schemes such as a probe scheme, a strip line scheme, an aperture coupled scheme, and the like.

FIGS. 4A and 4B are diagrams for describing a structure of a fan-out package included in an antenna module according to example embodiments.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device or system, or the like, in a packaged state.

Here, semiconductor packaging is beneficial due to the existence of a difference in a circuit width between the semiconductor chip and a printed circuit board (e.g., a mainboard) of the electronic device in terms of electrical connections. In detail, a size of connection pads (or pads) in the semiconductor chip and an interval between the connection pads in the semiconductor chip are very fine, but a size of component mounting pads in the printed circuit board used in the electronic device and an interval between the component mounting pads of the printed circuit board are larger than those of the semiconductor chip. Therefore, it may be difficult to directly mount the semiconductor chip on the printed circuit board, and packaging technology for buffering a difference in a circuit width between the semiconductor chip and the printed circuit board may be beneficial.

A semiconductor package manufactured by the packaging technology may be classified as a fan-in semiconductor package (or a fan-in package) or a fan-out semiconductor package (or a fan-out package) depending on a structure and a purpose thereof.

Referring to FIG. 4A, in a fan-out package 2100, for example, an outer side of a semiconductor chip 2120 may be protected by an encapsulant 2130, and pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the pads 2122, a passivation layer (not illustrated), and the like. The connection member 2140 may include an insulating layer 2141, redistribution layers 2142 formed on the insulating layer 2141, and vias 2143 electrically connecting the pads 2122 with the redistribution layers 2142.

As described above, the fan-out package may have a form in which I/O terminals of the semiconductor chip are redistributed and disposed outwardly of the semiconductor chip through the connection member formed on the semiconductor chip. In a fan-in package, all I/O terminals of the semiconductor chip may be disposed inside the semiconductor chip. Therefore, when a size of the semiconductor chip is decreased, a size and a pitch of balls may be decreased, such that a standardized ball layout may not be used in the fan-in package. On the other hand, the fan-out package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out package may be mounted on the printed circuit board of the electronic device without using a separate BGA substrate, as will be described below.

Referring to FIG. 4B, the fan-out package 2100 may be mounted on a printed circuit board 2500 of an electronic device through the solder balls 2170, or the like. As described above, the fan-out package 2100 may include the connection member 2140 formed on the semiconductor chip 2120 and capable of redistributing the pads 2122 to a fan-out region that is outside of a size of the semiconductor chip 2120, such that the standardized ball layout may be used in the fan-out package 2100 as it is. As a result, the fan-out package 2100 may be mounted on the printed circuit board 2500 of the electronic device without using a separate BGA substrate, or the like.

As described above, because the fan-out package is mounted on the printed circuit board of the electronic device without using the separate BGA substrate, the fan-out package may be implemented with a thickness lower than that of the fan-in package using the BGA substrate. Therefore, the fan-out package may be miniaturized and thinned. In addition, the fan-out package may have excellent thermal characteristics and electrical characteristics, such that it is particularly appropriate for a mobile product.

FIGS. 5, 6, 7, 8, 9, 10 and 11 are cross-sectional views of an antenna module according to example embodiments. The descriptions repeated with FIG. 1 will be omitted.

Figure 5:
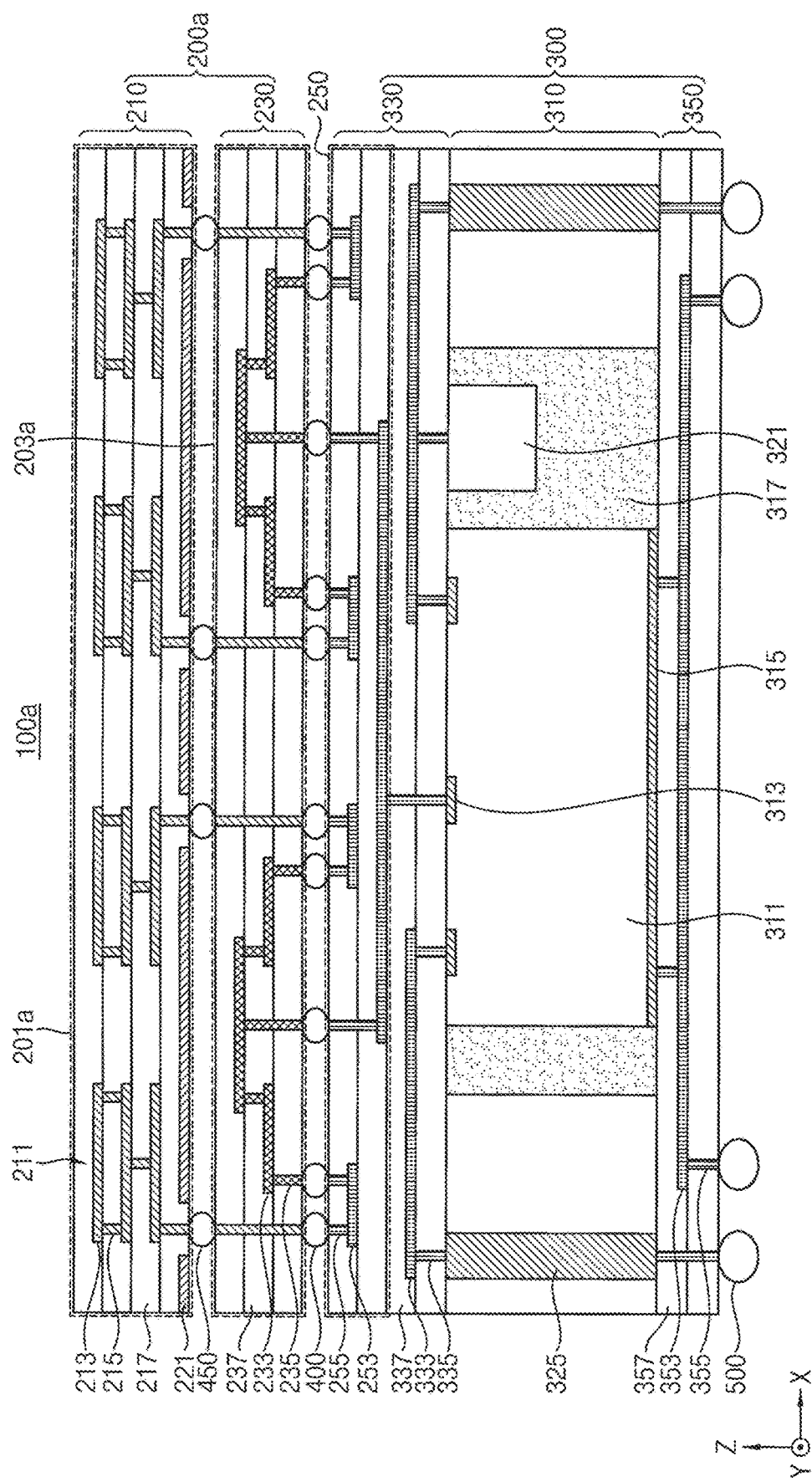
FIGS. 5, 6, 7, 8, 9, 10 and 11 are cross-sectional views of an antenna module according to example embodiments.

Referring to FIG. 5, an antenna module 100a includes an antenna substrate 200a, a fan-out package 300 and a plurality of first electrical connection structures 400. The antenna module 100a may further include a plurality of external electrical connection structures 500.

The antenna module 100a of FIG. 5 may be substantially the same as the antenna module 100 of FIG. 1, except that a structure of the antenna substrate 200a is changed in FIG. 5. The fan-out package 300, the plurality of first electrical connection structures 400 and the plurality of external electrical connection structures 500 in FIG. 5 may be substantially the same as the fan-out package 300, the plurality of first electrical connection structures 400 and the plurality of external electrical connection structures 500 in FIG. 1, respectively.

The antenna substrate 200a may include a first antenna substrate 201a, a second antenna substrate 203a and a plurality of second electrical connection structures 450.

The first antenna substrate 201a may be disposed on the second antenna substrate 203a, and the second antenna substrate 203a may be disposed under the first antenna substrate 201a. The first antenna substrate 201a and the second antenna substrate 203a may be separated from each other in the vertical direction Z. In other words, one antenna substrate 200 in FIG. 1 may be separated to form two antenna substrates 201a and 203a in FIG. 5.

The plurality of second electrical connection structures 450 may be disposed between the first antenna substrate 201a and the second antenna substrate 203a and may electrically connect the first antenna substrate 201a with the second antenna substrate 203a. Materials included in the plurality of second electrical connection structures 450 may be substantially the same as the materials included in the plurality of first electrical connection structures 400.

In an example embodiment of FIG. 5, the first antenna substrate 201a may include only the pattern layer 210, and the second antenna substrate 203a may include only the feeding layer 230. In other words, the pattern layer 210 and the feeding layer 230 included in the antenna substrate 200 of FIG. 1 may be separated and formed as separate antenna substrates 201a and 203a. The pattern layer 210 and the feeding layer 230 in FIG. 5 may be substantially the same as the pattern layer 210 and the feeding layer in FIG. 1, respectively.

In addition, in an example embodiment of FIG. 5, the first antenna substrate 201a and the second antenna substrate 203a may be independently and separately manufactured through separate processes and then electrically connected to each other by the plurality of second electrical connection structures 450. In other words, the first antenna substrate 201a and the second antenna substrate 203a may not be manufactured by being integrated and/or combined in a single process, but may be separately manufactured and then form one antenna substrate 200a in a manner that is electrically connected to each other through a subsequent process. Thus, in the antenna substrate 200a, the first antenna substrate 201a and the second antenna substrate 203a may be formed to be spaced apart from each other in the vertical direction Z, and a bottom surface of the first antenna substrate 201a and a top surface of the second antenna substrate 203a may be spaced apart from each other by a desired (and/or alternatively predetermined) distance. In this example, a TAT to design and develop the antenna substrate 200a may be further reduced, and a yield in manufacturing the antenna substrate 200a may be further improved or enhanced.

Figure 6:
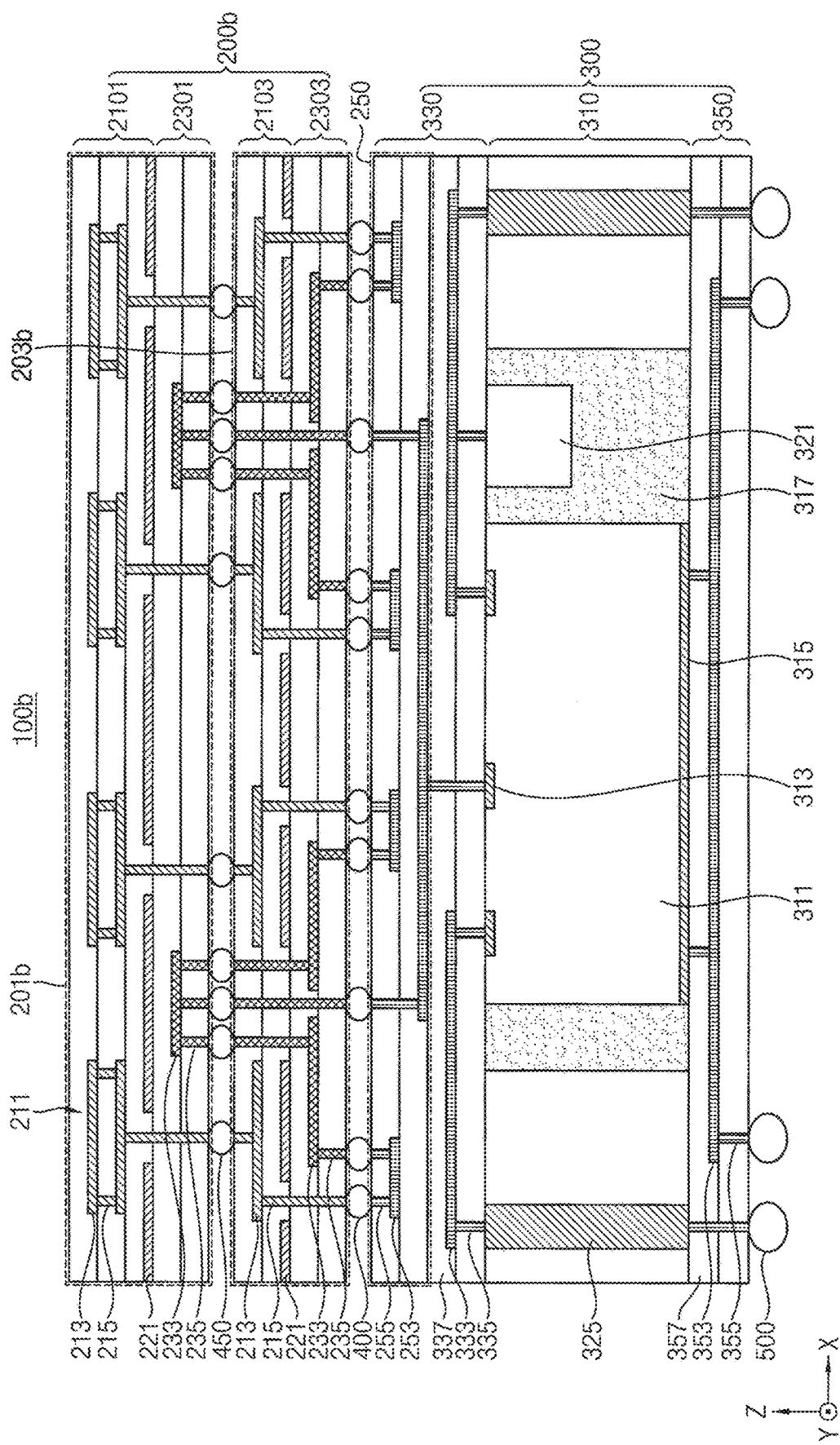

Referring to FIG. 6, an antenna module 100b includes an antenna substrate 200b, a fan-out package 300 and a plurality of first electrical connection structures 400. The antenna module 100b may further include a plurality of external electrical connection structures 500.

The antenna module 100b of FIG. 6 may be substantially the same as the antenna module 100 of FIG. 1, except that a structure of the antenna substrate 200b is changed in FIG. 6. The fan-out package 300, the plurality of first electrical connection structures 400 and the plurality of external electrical connection structures 500 in FIG. 6 may be substantially the same as the fan-out package 300, the plurality of first electrical connection structures 400 and the plurality of external electrical connection structures 500 in FIG. 1, respectively.

The antenna substrate 200b may include a first antenna substrate 201b, a second antenna substrate 203b and a plurality of second electrical connection structures 450.

As with the first antenna substrate 201a, the second antenna substrate 203a and the plurality of second electrical connection structures 450 in FIG. 5, the second antenna substrate 203b in FIG. 6 may be disposed under the first antenna substrate 201b in FIG. 6, the first antenna substrate 201b and the second antenna substrate 203b in FIG. 6 may be separated from each other in the vertical direction Z, and the plurality of second electrical connection structures 450 in FIG. 6 may be disposed between the first antenna substrate 201b and the second antenna substrate 203b in FIG. 6 and may be electrically connect the first antenna substrate 201b with the second antenna substrate 203b in FIG. 6. The first antenna substrate 201b and the second antenna substrate 203b may be independently and separately manufactured through separate processes and then electrically connected to each other by the plurality of second electrical connection structures 450.

A first portion 2101 and a second portion 2103 of the pattern layer may include the plurality of antenna wirings 213, the plurality of antenna vias 215 and the plurality of ground patterns 221, and the plurality of antenna patterns 211 may be formed by a combination of the first portion 2101 and the second portion 2103 of the pattern layer. A first portion 2301 and a second portion 2303 of the feeding layer may include the plurality of feeding wirings 233 and the plurality of feeding vias 235, and the feeding network may be formed by a combination of the first portion 2301 and the second portion 2303 of the feeding layer. The equivalent structure and/or equivalent connection of the antenna patterns 211 and the feeding network in FIG. 6 may be substantially the same as the equivalent structure and/or equivalent connection of the antenna patterns 211 and the feeding network in FIG. 1, respectively.

In an example embodiment of FIG. 6, the first antenna substrate 201b may include the portion 2101 of the pattern layer and the portion 2301 of the feeding layer, and the second antenna substrate 203b may include the remainder portion 2103 of the pattern layer other than the portion 2101 of the pattern layer and the remainder portion 2303 of the feeding layer other than the portion 2301 of the feeding layer. In other words, the pattern layer 210 included in the antenna substrate 200 of FIG. 1 may be divided into the first portion 2101 and the second portion 2103 and disposed in different antenna substrates 201b and 203b, and the feeding layer 230 included in the antenna substrate 200 of FIG. 1 may also be divided into the first portion 2301 and the second portion 2303 and disposed in different antenna substrates 201b and 203b.

Although the examples where one antenna substrate is divided into two antenna substrates in the vertical direction Z are illustrated in FIGS. 5 and 6, example embodiments are not limited thereto, and one antenna substrate may be divided into three or more antenna substrates in the vertical direction Z.

Figure 7:
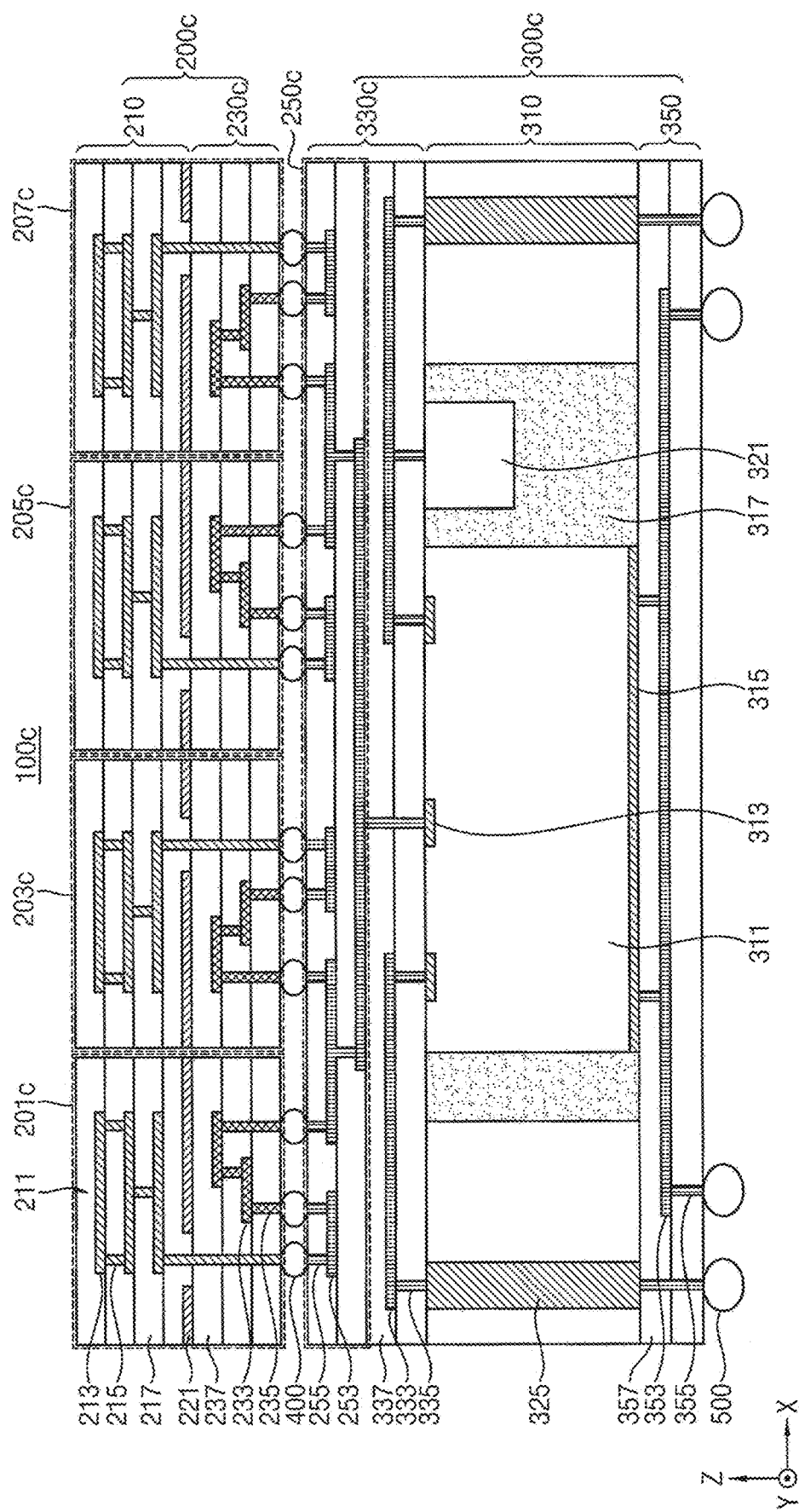

Referring to FIG. 7, an antenna module 100c includes an antenna substrate 200c, a fan-out package 300c and a plurality of first electrical connection structures 400. The antenna module 100c may further include a plurality of external electrical connection structures 500.

The antenna module 100c of FIG. 7 may be substantially the same as the antenna module 100 of FIG. 1, except that a structure of the antenna substrate 200c is changed in FIG. 7 and a structure of a first redistribution layer 330c included in the fan-out package 300c is changed in FIG. 7. The core layer 310 and the second redistribution layer 350 included in the fan-out package 300c, the plurality of first electrical connection structures 400 and the plurality of external electrical connection structures 500 in FIG. 7 may be substantially the same as the core layer 310 and the second redistribution layer 350 included in the fan-out package 300, the plurality of first electrical connection structures 400 and the plurality of external electrical connection structures 500 in FIG. 1, respectively.

The antenna substrate 200c may include a plurality of sub antenna substrates 201c, 203c, 205c and 207c.

The plurality of sub antenna substrates 201c, 203c, 205c and 207c may be separated from each other in a horizontal direction. For example, as illustrated in FIG. 7, the plurality of sub antenna substrates 201c, 203c, 205c and 207c may be separated along the first direction X and arranged independently one by one in a lattice form. Although not illustrated in FIG. 7, the plurality of sub antenna substrates may also be separated along the second direction Y and arranged independently one by one in a lattice form.

Each of the plurality of sub antenna substrates 201c, 203c, 205c and 207c may include the pattern layer 210 that includes the plurality of antenna wirings 213, the plurality of antenna vias 215 and the plurality of ground patterns 221, and a feeding layer 230c that includes the plurality of feeding wirings 233 and the plurality of feeding vias 235.

The plurality of antenna patterns 211 formed by the plurality of antenna wirings 213 and the plurality of antenna vias 215 in FIG. 7 may be substantially the same as the plurality of antenna patterns 211 in FIG. 1. However, as the plurality of sub antenna substrates 201c, 203c, 205c and 207c are separated in the horizontal direction, the feeding network formed by the plurality of feeding wirings 233 and the plurality of feeding vias 235 in FIG. 7 may not be exactly the same as the feeding network in FIG. 1.

The first redistribution layer 330c included in the fan-out package 300c may include a logic layer 250c that includes a plurality of logic patterns. As compared to FIG. 1, the logic layer 250c in FIG. 7 may further include additional logic wirings and logic vias for connecting at least portions of the plurality of feeding wirings 233. As a result, however, the equivalent structure and/or equivalent connection of the feeding network and the logic patterns in FIG. 7 may be substantially the same as the equivalent structure and/or equivalent connection of the feeding network and the logic patterns in FIG. 1, respectively.

In an example embodiment of FIG. 7, the number of the plurality of sub antenna substrates 201c, 203c, 205c and 207c may be substantially equal to the number of the plurality of antenna patterns 211. In other words, each of the plurality of sub antenna substrates 201c, 203c, 205c and 207c may include one antenna pattern 211. One antenna pattern 211 may be formed independently in one sub antenna substrate, and thus signal interference, delay, distortion, operation error, and the like may be reduced or prevented, and a size of the product may be reduced.

In addition, in an example embodiment of FIG. 7, the plurality of sub antenna substrates 201c, 203c, 205c and 207c may be independently and separately manufactured through separate processes and then electrically connected to the fan-out package 300c by the plurality of first electrical connection structures 400. In other words, the plurality of sub antenna substrates 201c, 203c, 205c and 207c may not be manufactured by being integrated and/or combined in a single process, but may be separately manufactured and then form one antenna substrate 200c in a manner that is electrically connected to each other through a subsequent process. Thus, in the antenna substrate 200c, the plurality of sub antenna substrates 201c, 203c, 205c and 207c may be formed to be spaced apart from each other in the horizontal direction (e.g., the first direction X), and side surfaces of the plurality of sub antenna substrates 201c, 203c, 205c and 207c may be spaced apart from each other by a desired (and/or alternatively predetermined) distance. In this example, a TAT to design and develop the antenna substrate 200c may be more reduced, and a yield in manufacturing the antenna substrate 200c may be more improved or enhanced.

Figure 8:
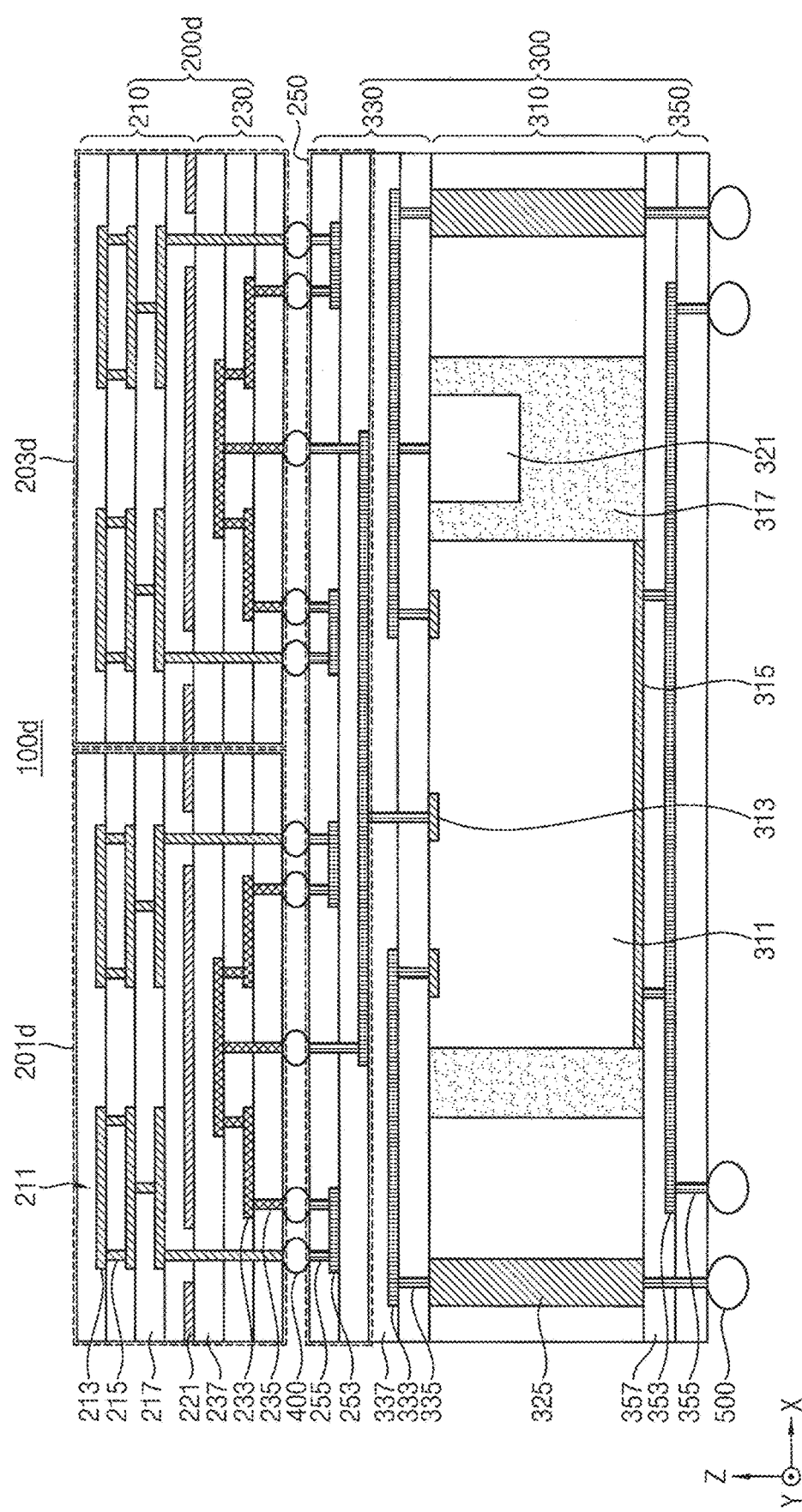

Referring to FIG. 8, an antenna module 100d includes an antenna substrate 200d, a fan-out package 300 and a plurality of first electrical connection structures 400. The antenna module 100d may further include a plurality of external electrical connection structures 500.

The antenna module 100d of FIG. 8 may be substantially the same as the antenna module 100 of FIG. 1, except that a structure of the antenna substrate 200d is changed in FIG. 8. The fan-out package 300, the plurality of first electrical connection structures 400 and the plurality of external electrical connection structures 500 in FIG. 8 may be substantially the same as the fan-out package 300, the plurality of first electrical connection structures 400 and the plurality of external electrical connection structures 500 in FIG. 1, respectively.

The antenna substrate 200d may include a plurality of sub antenna substrates 201d and 203d.

As with the plurality of sub antenna substrates 201c, 203c, 205c and 207c in FIG. 7, the plurality of sub antenna substrates 201d and 203d in FIG. 8 may be separated from each other in the horizontal direction. The plurality of sub antenna substrates 201d and 203d may be independently and separately manufactured through separate processes and then electrically connected to the fan-out package 300c by the plurality of first electrical connection structures 400.

Each of the plurality of sub antenna substrates 201d and 203d may include the pattern layer 210 that includes the plurality of antenna wirings 213, the plurality of antenna vias 215 and the plurality of ground patterns 221, and the feeding layer 230 that includes the plurality of feeding wirings 233 and the plurality of feeding vias 235. The plurality of antenna patterns 211 formed by the plurality of antenna wirings 213 and the plurality of antenna vias 215 in FIG. 8 and the feeding network formed by the plurality of feeding wirings 233 and the plurality of feeding vias 235 in FIG. 8 may be substantially the same as the plurality of antenna patterns 211 and the feeding network in FIG. 1, respectively.

In an example embodiment of FIG. 8, the number of the plurality of sub antenna substrates 201d and 203d may be less than the number of the plurality of antenna patterns 211. For example, each of the plurality of sub antenna substrates 201d and 203d may include two antenna patterns 211. However, example embodiments are not limited thereto, and the number of antenna patterns included in one sub antenna substrate may be changed according to example embodiments.

Although the example embodiments show one antenna substrate divided into two or more sub antenna substrates, each of which includes the antenna pattern 211 are described with reference to FIGS. 7 and 8, example embodiments are not limited thereto, and one antenna substrate may be divided into any other types of structures, including the antenna pattern 211, other than sub antenna substrates.

Figure 9:
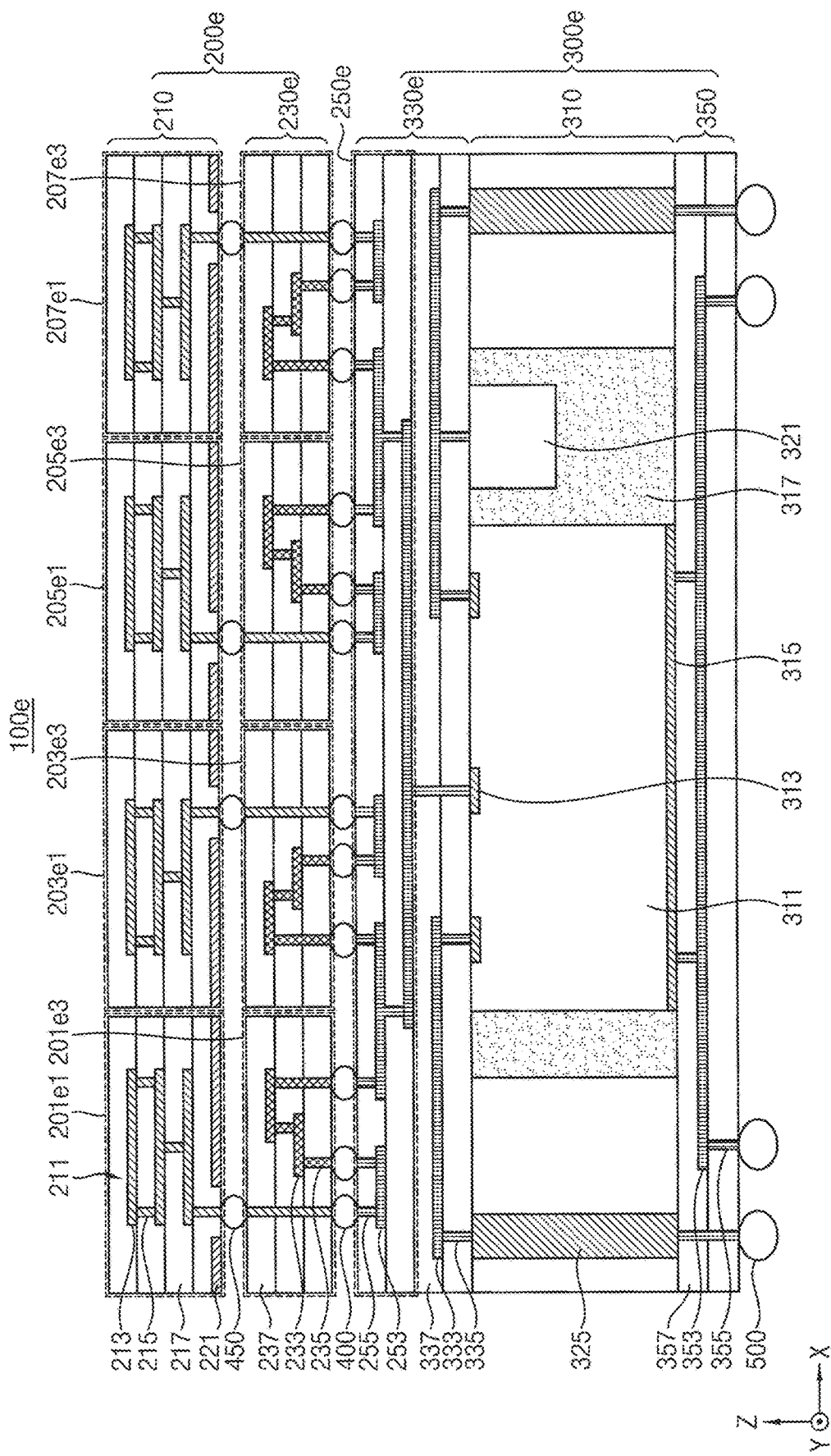

Referring to FIG. 9, an antenna module 100e includes an antenna substrate 200e, a fan-out package 300e and a plurality of first electrical connection structures 400. The antenna module 100e may further include a plurality of external electrical connection structures 500.

The antenna module 100e of FIG. 9 may be substantially the same as the antenna module 100 of FIG. 1, except that a structure of the antenna substrate 200e is changed in FIG. 9 and a structure of a first redistribution layer 330e included in the fan-out package 300e is partially changed in FIG. 9. The core layer 310 and the second redistribution layer 350 included in the fan-out package 300e, the plurality of first electrical connection structures 400 and the plurality of external electrical connection structures 500 in FIG. 9 may be substantially the same as the core layer 310 and the second redistribution layer 350 included in the fan-out package 300, the plurality of first electrical connection structures 400 and the plurality of external electrical connection structures 500 in FIG. 1, respectively.

The antenna substrate 200e in FIG. 9 may have a form in which the antenna substrate 200a in FIG. 5 and the antenna substrate 200c in FIG. 7 are combined.

For example, the antenna substrate 200e may include a first antenna substrate and a second antenna substrate that are separated from each other in the vertical direction Z, and may include a plurality of second electrical connection structures 450. The first antenna substrate in the antenna substrate 200e may include a plurality of first sub antenna substrates 201e1, 203e1, 205e1 and 207e1 that are separated from each other in the horizontal direction (e.g., the first direction X), and the second antenna substrate in the antenna substrate 200e may include a plurality of second sub antenna substrates 201e3, 203e3, 205e3 and 207e3 that are separated from each other in the horizontal direction.

In views of separation in the vertical direction Z, the first antenna substrate and the second antenna substrate and the plurality of second electrical connection structures 450 in the antenna substrate 200e of FIG. 9 may be substantially the same as the first antenna substrate 201b, the second antenna substrate 203b and the plurality of second electrical connection structures 450 in FIG. 5, respectively.

In views of separation in the horizontal direction, a combination of one (e.g., the first sub antenna substrate 201e1) of the plurality of first sub antenna substrates 201e1, 203e1, 205e1 and 207e1 and a respective one (e.g., the second sub antenna substrate 201e3) of the plurality of second sub antenna substrates 201e3, 203e3, 205e3 and 207e3 in the antenna substrate 200e of FIG. 9 may be substantially the same as one (e.g., the sub antenna substrate 201c) of the plurality of sub antenna substrates 201c, 203c, 205c and 207c in FIG. 7. Thus, it may also be described that the antenna substrate 200e includes a plurality of sub antenna substrates separated from each other in the horizontal direction and each of the plurality of sub antenna substrates include a respective one of the plurality of first sub antenna substrates 201e1, 203e1, 205e1 and 207e1, a respective one of the plurality of second sub antenna substrates 201e3, 203e3, 205e3 and 207e3, and the plurality of second electrical connection structures 450.

The fan-out package 300e, the first redistribution layer 330e and the logic layer 250e in FIG. 9 may bee substantially the same as the fan-out package 300c, the first redistribution layer 330c and the logic layer 250c in FIG. 7, respectively.

In an example embodiment of FIG. 9, the number of the plurality of first sub antenna substrates 201e1, 203e1, 205e1 and 207e1 may be substantially equal to the number of the plurality of second sub antenna substrates 201e3, 203e3, 205e3 and 207e3.

Figure 10:
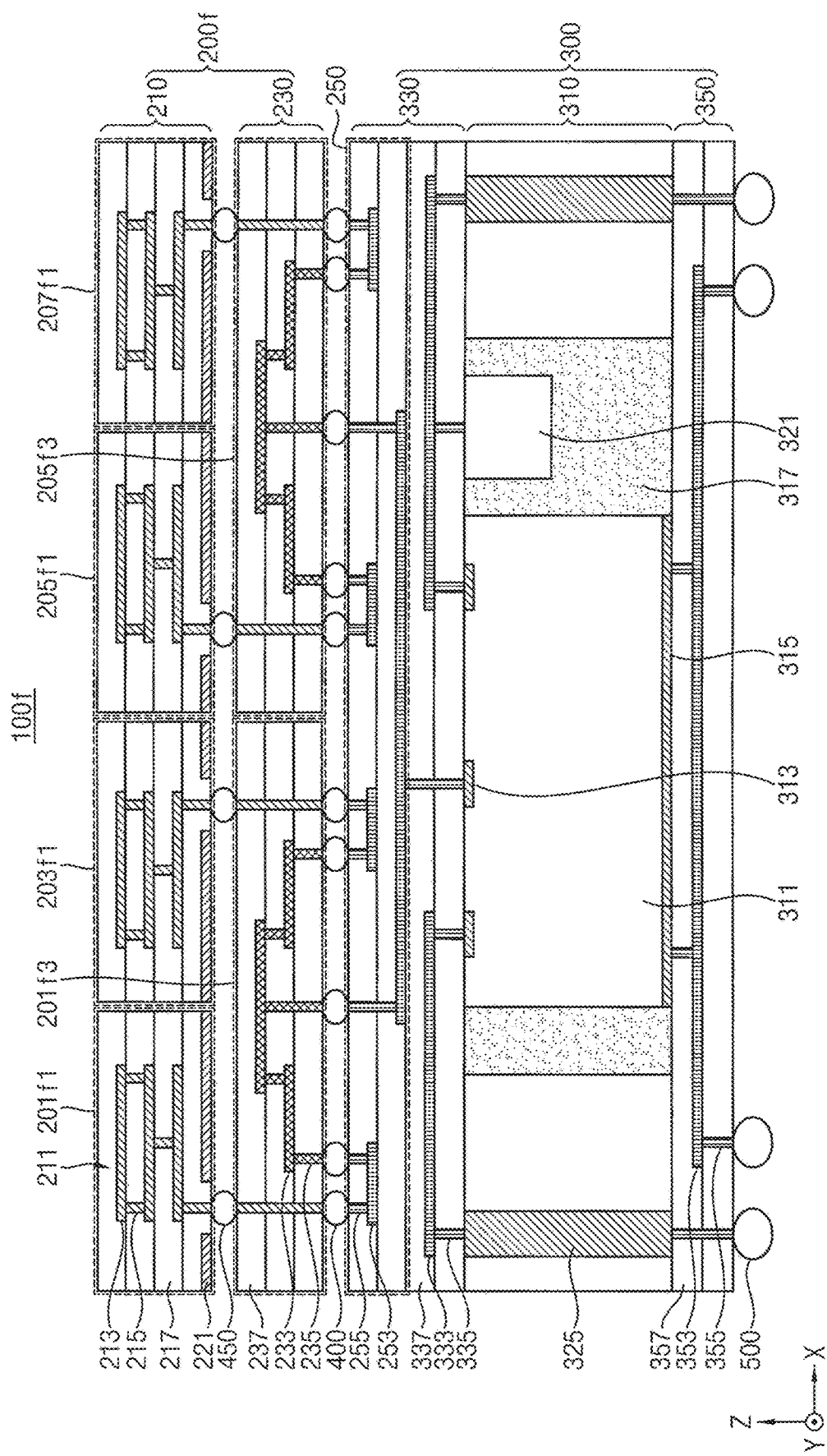

Referring to FIG. 10, an antenna module 100f includes an antenna substrate 200f, a fan-out package 300 and a plurality of first electrical connection structures 400. The antenna module 100f may further include a plurality of external electrical connection structures 500.

The antenna module 100f of FIG. 10 may be substantially the same as the antenna module 100 of FIG. 1, except that a structure of the antenna substrate 200f is changed in FIG. 10. The fan-out package 300, the plurality of first electrical connection structures 400 and the plurality of external electrical connection structures 500 in FIG. 10 may be substantially the same as the fan-out package 300, the plurality of first electrical connection structures 400 and the plurality of external electrical connection structures 500 in FIG. 1, respectively.

The antenna substrate 200f in FIG. 10 may have a form in which the antenna substrate 200a in FIG. 5, the antenna substrate 200c in FIG. 7 and the antenna substrate 200d in FIG. 8 are combined.

For example, the antenna substrate 200f may include a first antenna substrate and a second antenna substrate that are separated from each other in the vertical direction Z, and may include a plurality of second electrical connection structures 450. The first antenna substrate in the antenna substrate 200f may include a plurality of first sub antenna substrates 201f1, 203f1, 205f1 and 207f1 that are separated from each other in the horizontal direction (e.g., the first direction X), the second antenna substrate in the antenna substrate 200f may include a plurality of second sub antenna substrates 201f3 and 205f3 that are separated from each other in the horizontal direction.

In views of separation in the vertical direction Z, the first antenna substrate and the second antenna substrate and the plurality of second electrical connection structures 450 in the antenna substrate 200f of FIG. 10 may be substantially the same as the first antenna substrate 201b, the second antenna substrate 203b and the plurality of second electrical connection structures 450 in FIG. 5, respectively.

In views of separation in the horizontal direction, one (e.g., the first sub antenna substrate 201f1) of the plurality of first sub antenna substrates 201f1, 203f1, 205f1 and 207f1 in the antenna substrate 200f of FIG. 10 may correspond to the pattern layer 210 of one (e.g., the sub antenna substrate 201c) of the plurality of sub antenna substrates 201c, 203c, 205c and 207c in FIG. 7, and one (e.g., the second sub antenna substrate 201f3) of the plurality of second sub antenna substrates 201f3 and 205f3 in the antenna substrate 200f of FIG. 10 may correspond to the feeding layer 230 of one (e.g., the sub antenna substrate 201d) of the plurality of sub antenna substrates 201d and 203d in FIG. 8.

In an example embodiment of FIG. 10, the number of the plurality of first sub antenna substrates 201f1, 203f1, 205f1 and 207f1 may be different from the number of the plurality of second sub antenna substrates 201f3 and 205f3. For example, the number of the plurality of second sub antenna substrates 201f3 and 205f3 may be less than the number of the plurality of first sub antenna substrates 201f1, 203f1, 205f1 and 207f1. However, example embodiments are not limited thereto, and the number of the plurality of second sub antenna substrates may be greater than the number of the plurality of first sub antenna substrates.

Although the examples where the antenna substrate 200a in FIG. 5 is additionally divided in the horizontal direction are described with reference to FIGS. 9 and 10, example embodiments are not limited thereto, and the antenna substrate 200b in FIG. 6 may be additionally divided in the horizontal direction.

Figure 11:
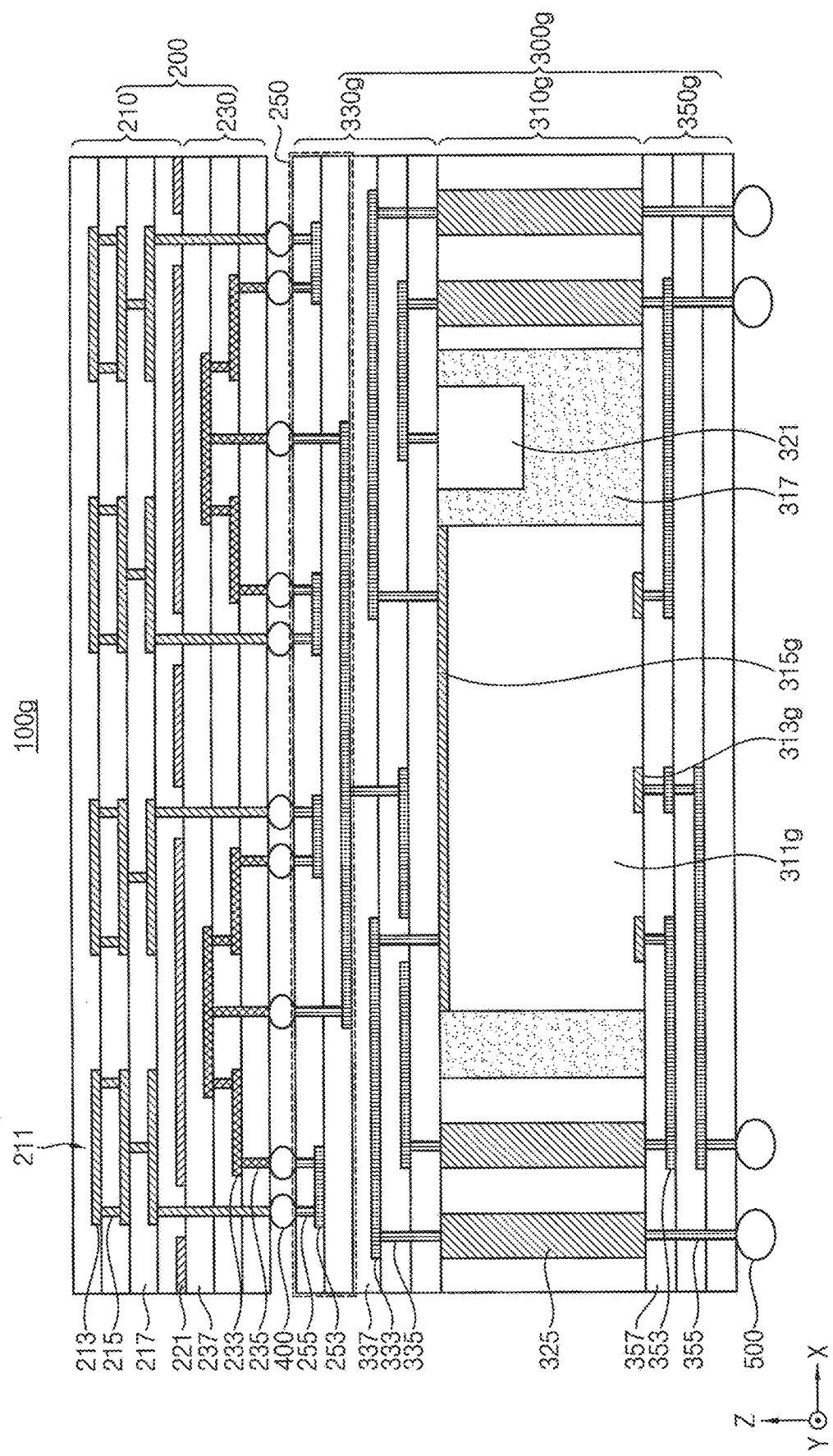

Referring to FIG. 11, an antenna module 100g includes an antenna substrate 200, a fan-out package 300g and a plurality of first electrical connection structures 400. The antenna module 100 may further include a plurality of external electrical connection structures 500.

The antenna module 100g of FIG. 11 may be substantially the same as the antenna module 100 of FIG. 1, except that a structure of a semiconductor chip 311g included in a core layer 310g of the fan-out package 300g is changed in FIG. 11 and structures of a first redistribution layer 330g and a second redistribution layer 350g included in the fan-out package 300g are partially changed in FIG. 11. The antenna substrate 200, the plurality of first electrical connection structures 400 and the plurality of external electrical connection structures 500 in FIG. 11 may be substantially the same as the antenna substrate 200, the plurality of first electrical connection structures 400 and the plurality of external electrical connection structures 500 in FIG. 1, respectively.

The core layer 310g includes the semiconductor chip 311g and an encapsulant 317. The core layer 310g may further include a metal layer 315g, at least one passive element 321 and core vias 325.

As with the semiconductor chip 311 in FIG. 1, the semiconductor chip 311g in FIG. 11 may include an active surface having pads 313g disposed thereon and an inactive surface opposite to the active surface. Unlike the semiconductor chip 311 in FIG. 1, the semiconductor chip 311g may be disposed in face-down form such that the inactive surface is directed toward the antenna substrate 200 in an example embodiment of FIG. 11. When the semiconductor chip 311g is disposed in face-down form, the active surface of the semiconductor chip 311g may become close to the external printed circuit board to have a high heat dissipation effect to the external printed circuit board. The metal layer 315g may be formed on the inactive surface of the semiconductor chip 311g, and may be replaced by a die attachment film in some cases.

The encapsulant 317, the passive element 321 and the core vias 325 in FIG. 11 may be substantially the same as the encapsulant 317, the passive element 321 and the core vias 325 in FIG. 1, respectively.

The first redistribution layer 330g may electrically connect the semiconductor chip 311g, the antenna substrate 200 and the passive element 321, and the second redistribution layer 350g may electrically connect the semiconductor chip 311g and the external printed circuit board. As compared to FIG. 1, arrangements of the plurality of wirings 333 and 353 and the plurality of vias 335 and 355 included in the first redistribution layer 330g and the second redistribution layer 350g in FIG. 11 may be changed. As a result, however, the equivalent structure and/or equivalent connection of the plurality of wirings 333 and 353 and the plurality of vias 335 and 355 in FIG. 11 may be substantially the same as the equivalent structure and/or equivalent connection of the plurality of wirings 333 and 353 and the plurality of vias 335 and 355 in FIG. 1, respectively.

Although not illustrated in detail, the fan-out package 300g in FIG. 11 may also be applied to the antenna modules 100a, 100b, 100c, 100d, 100e and 100f described with reference to FIGS. 5 through 10.

FIG. 12 is a block diagram illustrating an electronic system according to example embodiments.

Referring to FIG. 12, an electronic system 4000 includes at least one processing circuitry 4100, a communication module 4200, a display/touch module 4300, a storage device 4400 and a memory device 4500. For example, the electronic system 4000 may be any mobile system or any computing system.

The processing circuitry 4100 (or other circuitry, for example, the communication module 4200, the display/touch module 4300, the storage device 4400 and the memory device 4500, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The processing circuitry 4100 controls operations of the electronic system 4000. The processing circuitry 4100 may execute an operating system and at least one application to provide an internet browser, games, videos, or the like. The communication module 4200 is controlled by the processing circuitry 4100 and performs wireless or wire communications with an external system. The display/touch module 4300 displays data processed by the processing circuitry 4100 and/or receives data through a touch panel. The storage device 4400 stores user data. The memory device 4500 temporarily stores data used for processing operations of the electronic system 4000.

The communication module 4200 includes an antenna module 4210. The antenna module 4210 may be the antenna module according to example embodiments in which the logic layer is not disposed in the antenna substrate, but is disposed in the redistribution layer of the fan-out package. Accordingly, a thickness of the antenna substrate may be reduced, a TAT may be reduced, and a manufacturing yield may be improved or enhanced.

The inventive concepts may be applied to various electronic devices and/or systems including the antenna module. For example, the inventive concepts may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An antenna module comprising:
   an antenna substrate comprising
      a pattern layer including a plurality of antenna patterns and a plurality of ground patterns; and
      a feeding layer under the pattern layer and including a feeding network configured to supply power to the plurality of antenna patterns;
   a fan-out package under the antenna substrate, the fan-out package comprising
      a semiconductor chip configured to drive the antenna substrate;
      an encapsulant encapsulating at least portions of the semiconductor chip;
      a first redistribution layer on the semiconductor chip and electrically connecting the semiconductor chip with the antenna substrate; and
      a second redistribution layer under the semiconductor chip and electrically connecting the semiconductor chip with an external printed circuit board; and
   a plurality of first electrical connection structures between the antenna substrate and the fan-out package and electrically connecting the antenna substrate with the fan-out package,
   wherein a logic layer that includes a plurality of logic patterns electrically connecting the pattern layer with the feeding layer in the antenna substrate is within the first redistribution layer in the fan-out package.

2. The antenna module of claim 1, wherein the antenna substrate and the fan-out package are separate and electrically connected to each other by the plurality of first electrical connection structures.

3. The antenna module of claim 1, wherein the antenna substrate includes:
   a first antenna substrate;
   a second antenna substrate under the first antenna substrate and separated from the first antenna substrate in a vertical direction; and a plurality of second electrical connection structures between the first antenna substrate and the second antenna substrate and electrically connecting the first antenna substrate with the second antenna substrate.

4. The antenna module of claim 3, wherein:
the first antenna substrate includes the pattern layer, and the second antenna substrate includes the feeding layer.

5. The antenna module of claim 3, wherein:
the first antenna substrate includes at least portions of the pattern layer and at least portions of the feeding layer, and
the second antenna substrate includes a remainder of the pattern layer other than the at least portions of the pattern layer and a remainder of the feeding layer other than the at least portions of the feeding layer.

6. The antenna module of claim 3, wherein:
the first antenna substrate includes a plurality of first sub antenna substrates separated from each other in a horizontal direction, and
the second antenna substrate includes a plurality of second sub antenna substrates separated from each other in the horizontal direction.

7. The antenna module of claim 6, wherein a number of the plurality of first sub antenna substrates is equal to a number of the plurality of second sub antenna substrates.

8. The antenna module of claim 6, wherein a number of the plurality of first sub antenna substrates is different from a number of the plurality of second sub antenna substrates.

9. The antenna module of claim 1, wherein:
the antenna substrate includes a plurality of sub antenna substrates separated from each other in a horizontal direction, and
each of the plurality of sub antenna substrates includes at least one of the plurality of antenna patterns.

10. The antenna module of claim 9, wherein a number of the plurality of sub antenna substrates is equal to a number of the plurality of antenna patterns.

11. The antenna module of claim 9, wherein a number of the plurality of sub antenna substrates is less than a number of the plurality of antenna patterns.

12. The antenna module of claim 9, wherein each of the plurality of sub antenna substrates includes:
a first sub antenna substrate;
a second sub antenna substrate under the first sub antenna substrate and separated from the first sub antenna substrate in a vertical direction; and
a plurality of second electrical connection structures between the first sub antenna substrate and the second sub antenna substrate and electrically connecting the first sub antenna substrate with the second sub antenna substrate.

13. The antenna module of claim 1, wherein the fan-out package further includes at least one passive element.

14. The antenna module of claim 1, wherein the semiconductor chip includes a radio frequency integrated circuit (RFIC).

15. The antenna module of claim 1, wherein the semiconductor chip includes a power management integrated circuit (PMIC).

16. The antenna module of claim 1, wherein the plurality of antenna patterns include at least one of a patch antenna and a dipole antenna.

17. The antenna module of claim 1, wherein:
the semiconductor chip includes an active surface having pads thereon and an inactive surface opposite to the active surface, and
the semiconductor chip is in face-up form such that the active surface is directed toward the antenna substrate.

18. The antenna module of claim 1, wherein:
the semiconductor chip includes an active surface having pads thereon and an inactive surface opposite to the active surface, and
the semiconductor chip is in face-down form such that the inactive surface is directed toward the antenna substrate.

19. An electronic system comprising:
a processor; and
a communication module controlled by the processor and configured to communicate with an external system, the communication module including an antenna module,
the antenna module comprising
an antenna substrate comprising
a pattern layer including a plurality of antenna patterns and a plurality of ground patterns; and
a feeding layer under the pattern layer and including a feeding network configured to supply power to the plurality of antenna patterns;
a fan-out package under the antenna substrate, the fan-out package comprising
a semiconductor chip configured to drive the antenna substrate;
an encapsulant encapsulating at least portions of the semiconductor chip;
a first redistribution layer on the semiconductor chip and electrically connecting the semiconductor chip with the antenna substrate; and
a second redistribution layer under the semiconductor chip and electrically connecting the semiconductor chip with an external printed circuit board; and
a plurality of first electrical connection structures between the antenna substrate and the fan-out package and electrically connecting the antenna substrate with the fan-out package,
wherein a logic layer that includes a plurality of logic patterns electrically connecting the pattern layer with the feeding layer in the antenna substrate is within the first redistribution layer in the fan-out package.

20. An antenna module comprising:
an antenna substrate comprising
a pattern layer including a plurality of antenna patterns and a plurality of ground patterns; and
a feeding layer under the pattern layer and including a feeding network configured to supply power to the plurality of antenna patterns;
a fan-out package under the antenna substrate, the fan-out package comprising
a semiconductor chip configured to drive the antenna substrate and including at least one of a radio frequency integrated circuit (RFIC) and a power management integrated circuit (PMIC);
a passive element adjacent to the semiconductor chip and including at least one of a capacitor and an inductor;
an encapsulant encapsulating at least portions of the semiconductor chip and the passive element;
a first redistribution layer on the semiconductor chip and electrically connecting the semiconductor chip with the antenna substrate;
a second redistribution layer under the semiconductor chip and electrically connecting the semiconductor chip with an external printed circuit board; and a plurality of core vias electrically connecting the first redistribution layer with the second redistribution layer;

a plurality of first electrical connection structures between the antenna substrate and the fan-out package and electrically connecting the antenna substrate with the fan-out package; and a plurality of external electrical connection structures under the fan-out package and electrically connecting the antenna module with the external printed circuit board, wherein a logic layer that includes a plurality of logic patterns electrically connecting the pattern layer with the feeding layer in the antenna substrate is within the first redistribution layer in the fan-out package, wherein the pattern layer and the feeding layer are not electrically connected to each other in the antenna substrate but are electrically connected to each other through the logic layer in the fan-out package, wherein a bottom surface of the antenna substrate and a top surface of the fan-out package are spaced apart from each other by a distance, wherein the semiconductor chip includes an active surface having pads thereon and an inactive surface opposite to the active surface, and wherein the semiconductor chip is in face-up form such that the active surface is directed toward the antenna substrate.

* * * * *